United States Patent
Rudolph et al.

(10) Patent No.: US 9,201,314 B2
(45) Date of Patent: Dec. 1, 2015

(54) APPARATUS FOR PREPARING RELIEF PRINTING FORM

(75) Inventors: Michael Lee Rudolph, Newark, DE (US); Joseph Anthony Perrotto, Landenberg, PA (US); Dhiren V Patel, Hockessin, DE (US); Robert A McMillen, Downingtown, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 50 days.

(21) Appl. No.: 13/493,004

(22) Filed: Jun. 11, 2012

(65) Prior Publication Data
US 2013/0148089 A1  Jun. 13, 2013

Related U.S. Application Data

(60) Division of application No. 12/401,106, filed on Mar. 10, 2009, now Pat. No. 8,241,835, which is a continuation-in-part of application No. 12/356,752, filed on Jan. 21, 2009, now abandoned.

(60) Provisional application No. 61/062,916, filed on Jan. 30, 2008.

(51) Int. Cl.
| | |
|---|---|
| *F26B 3/34* | (2006.01) |
| *F26B 7/00* | (2006.01) |
| *G03F 7/26* | (2006.01) |
| *G03F 7/20* | (2006.01) |

(Continued)

(52) U.S. Cl.
CPC .............. *G03F 7/70858* (2013.01); *G03F 1/68* (2013.01); *G03F 7/2012* (2013.01); *G03F 1/003* (2013.01)

(58) Field of Classification Search
CPC ...... G03F 7/70858; G03F 7/2012; G03F 1/68; G03F 1/003; B41N 1/06
USPC ............... 34/275, 276, 307–311; 355/30, 85; 430/306, 281.1
See application file for complete search history.

(56) References Cited

U.S. PATENT DOCUMENTS

| | | |
|---|---|---|
| 2,927,024 A | 3/1960 | Woodward et al. |
| 3,060,023 A | 10/1962 | Burg et al. |

(Continued)

FOREIGN PATENT DOCUMENTS

| | | |
|---|---|---|
| EP | 0 017 927 | 10/1980 |
| EP | 0 741 330 A1 | 11/1996 |

(Continued)

OTHER PUBLICATIONS

U.S. Appl. No. 12/346,608, filed Jan. 7, 2009, Rudolph.

(Continued)

*Primary Examiner* — Kenneth Rinehart
*Assistant Examiner* — John McCormack

(57) ABSTRACT

The invention provides an apparatus for preparing a relief printing form from a photosensitive element. More specifically, this invention describes an apparatus for preparing a relief form in an environment having controlled oxygen concentration during exposure to actinic radiation. The apparatus includes means for exposing a photosensitive element having an in-situ mask to actinic radiation through the in-situ mask in an environment having an inert gas and a concentration of oxygen between 190,000 and 100 ppm, and treating the exposed element to form the relief printing form having a pattern of raised surface areas.

15 Claims, 9 Drawing Sheets

(51) Int. Cl.
 *G03F 1/68* (2012.01)
 *G03F 1/00* (2012.01)

(56) References Cited

U.S. PATENT DOCUMENTS

| | | | |
|---|---|---|---|
| 3,144,331 A | 8/1964 | Thommes | |
| 3,264,103 A | 8/1966 | Cohen et al. | |
| 3,796,602 A | 3/1974 | Briney et al. | |
| 3,936,950 A * | 2/1976 | Troue | 34/276 |
| 4,045,231 A | 8/1977 | Toda et al. | |
| 4,177,074 A | 12/1979 | Proskow | |
| 4,323,636 A | 4/1982 | Chen | |
| 4,323,637 A | 4/1982 | Chen et al. | |
| 4,427,759 A | 1/1984 | Gruetzmacher et al. | |
| 4,430,417 A | 2/1984 | Heinz et al. | |
| 4,431,723 A | 2/1984 | Proskow | |
| 4,460,675 A | 7/1984 | Gruetzmacher et al. | |
| 4,517,279 A | 5/1985 | Worns | |
| 4,540,649 A | 9/1985 | Sakurai | |
| 4,726,877 A | 2/1988 | Fryd et al. | |
| 4,753,865 A | 6/1988 | Fryd et al. | |
| 4,806,506 A | 2/1989 | Gibson, Jr. | |
| 4,894,315 A | 1/1990 | Feinberg et al. | |
| 4,942,111 A | 7/1990 | Wade et al. | |
| 4,956,252 A | 9/1990 | Fryd et al. | |
| 5,015,556 A | 5/1991 | Martens | |
| 5,175,072 A | 12/1992 | Martens | |
| 5,215,859 A | 6/1993 | Martens | |
| 5,262,275 A | 11/1993 | Fan | |
| 5,279,697 A | 1/1994 | Peterson et al. | |
| 5,301,610 A | 4/1994 | McConnell | |
| 5,330,882 A | 7/1994 | Kawaguchi et al. | |
| 5,385,611 A | 1/1995 | Matsumoto et al. | |
| 5,486,384 A | 1/1996 | Bastian et al. | |
| 5,506,086 A | 4/1996 | Van Zoeren | |
| 5,516,626 A | 5/1996 | Ohmi et al. | |
| 5,607,814 A | 3/1997 | Fan et al. | |
| 5,645,974 A | 7/1997 | Ohta et al. | |
| 5,654,125 A | 8/1997 | Fan et al. | |
| 5,679,485 A | 10/1997 | Suzuki et al. | |
| 5,688,633 A | 11/1997 | Leach | |
| 5,705,310 A | 1/1998 | Van Zoeren | |
| 5,707,773 A | 1/1998 | Grossman et al. | |
| 5,719,009 A | 2/1998 | Fan | |
| 5,760,880 A | 6/1998 | Fan et al. | |
| 5,766,819 A | 6/1998 | Blanchet-Fincher | |
| 5,798,019 A | 8/1998 | Cushner et al. | |
| 5,830,621 A | 11/1998 | Suzuki et al. | |
| 5,840,463 A | 11/1998 | Blanchet-Fincher | |
| 5,863,704 A | 1/1999 | Sakurai et al. | |
| 5,888,701 A | 3/1999 | Fan | |
| 6,037,102 A | 3/2000 | Loerzer et al. | |
| 6,059,295 A * | 5/2000 | Thompson | 277/630 |
| 6,146,100 A * | 11/2000 | Broucke | 417/28 |
| 6,185,840 B1 * | 2/2001 | Noelle et al. | 34/278 |
| 6,223,453 B1 * | 5/2001 | Matheson et al. | 34/276 |
| 6,238,837 B1 | 5/2001 | Fan | |
| 6,284,431 B1 | 9/2001 | Tanizaki et al. | |
| 6,558,876 B1 | 5/2003 | Fan | |
| 6,673,509 B1 | 1/2004 | Metzger | |
| 6,766,740 B1 | 7/2004 | Wier | |
| 6,773,859 B2 | 8/2004 | Fan et al. | |
| 6,797,454 B1 | 9/2004 | Johnson et al. | |
| 6,929,898 B2 | 8/2005 | Fan | |
| 7,105,206 B1 | 9/2006 | Beck et al. | |
| 7,318,994 B2 * | 1/2008 | Long et al. | 430/302 |
| 7,348,123 B2 | 3/2008 | Mengel et al. | |
| 7,399,575 B2 | 7/2008 | Takagi et al. | |
| 8,236,479 B2 | 8/2012 | Rudolph | |
| 2002/0115019 A1 | 8/2002 | Kaczun et al. | |
| 2003/0211419 A1 | 11/2003 | Fan | |
| 2004/0048199 A1 | 3/2004 | Schadebrodt et al. | |
| 2004/0191690 A1 * | 9/2004 | Hayakawa | 430/277.1 |
| 2004/0234886 A1 | 11/2004 | Rudolph et al. | |
| 2004/0259033 A1 | 12/2004 | Kunita | |
| 2005/0142480 A1 | 6/2005 | Bode et al. | |
| 2005/0231708 A1 * | 10/2005 | Sunagawa et al. | 355/85 |
| 2005/0266358 A1 | 12/2005 | Roberts et al. | |
| 2006/0016355 A1 | 1/2006 | Saai et al. | |
| 2006/0055761 A1 | 3/2006 | Daems et al. | |
| 2006/0105268 A1 | 5/2006 | Vest | |
| 2006/0124008 A1 * | 6/2006 | Kessenich et al. | 101/401.1 |
| 2006/0144272 A1 | 7/2006 | Haraguchi et al. | |
| 2008/0063979 A1 | 3/2008 | Tomita et al. | |
| 2010/0218694 A1 * | 9/2010 | Wier et al. | 101/483 |
| 2012/0060711 A1 | 3/2012 | Rudolph | |

FOREIGN PATENT DOCUMENTS

| | | |
|---|---|---|
| EP | 0 891 877 A2 | 1/1999 |
| EP | 0 945 753 | 9/1999 |
| EP | 1 160 627 A | 12/2001 |
| JP | 53-008655 | 1/1978 |
| JP | 58-063939 | 4/1983 |
| JP | 03-239263 | 10/1991 |
| JP | 06-214377 | 8/1994 |
| JP | 2004-302477 | 10/2004 |
| JP | 2005-316325 | 11/2005 |
| JP | 2009-058902 | 3/2009 |
| NL | 8 900 784 A | 10/1990 |
| WO | WO 92/21518 A | 12/1992 |
| WO | WO 2005/026836 A | 3/2005 |
| WO | WO 2008/034810 A2 | 3/2008 |
| WO | WO 2009/033124 A | 3/2009 |

OTHER PUBLICATIONS

Flexography: Principles and Practice, Ronkonkoma, New York—4th Edition and 5th Edition, 1999 (Book Not Included).
B. Taylor, R. Fan, G. Blanchet,"The Digital Difference", FLEXO™ Magazine, Jul. 1997.
U.S. Appl. No. 13/527,771, filed Jun. 20, 2012, Rudolph.
U.S. Appl. No. 13/320,831, filed Jul. 1, 2010, Rudolph.
U.S. Appl. No. 12/349,608, filed Jan. 7, 2009, Rudolph.
U.S. Appl. No. 13/593,092, filed Aug. 23, 2012, Schieffer.
U.S. Appl. No. 61/692,457, filed Aug. 23, 2012 Schieffer.

* cited by examiner

APPARATUS FOR PREPARING RELIEF PRINTING FORM

BACKGROUND OF THE INVENTION

1. Field of the Disclosure

This invention pertains to a method and an apparatus for preparing a relief printing form. More specifically, this invention describes a method and an apparatus for preparing the relief printing form from a photosensitive element that is exposed to actinic radiation in an environment having controlled oxygen concentration.

2. Description of Related Art

Flexographic printing plates are widely used for printing of packaging materials including corrugated carton boxes, cardboard boxes, continuous web of paper, and continuous web of plastic films. Flexographic printing plates are a form of relief printing in which ink is carried from a raised-image surface and transferred to a substrate. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element.

Flexographic printing forms are characterized by their ability to crosslink or cure upon exposure to actinic radiation. Typically, the printing form precursor is uniformly exposed through its backside, i.e., backflashed, to a specified amount of actinic radiation to form a floor, and is imagewise exposed through its front side with the same actinic radiation that was used for the backflash exposure. The imagewise exposure can be through an image-bearing art-work or a phototool, such as a photographic negative or transparency (e.g. silver halide film), that is held in intimate contact under vacuum to the photopolymerizable layer, so called analog workflow. Alternatively, imagewise exposure can be through an in-situ mask having radiation opaque areas and transparent areas that had been previously formed above the photopolymerizable layer, so called digital workflow. The precursor is exposed to actinic radiation, such as ultraviolet (UV) radiation, to selectively cure the photopolymerizable layer. The actinic radiation enters the photosensitive element through the transparent areas and is blocked from entering the photopolymerizable layer by the black or opaque areas of the transparency or in-situ mask. The areas of the photopolymerizable layer that are exposed to the actinic radiation cure or hardened and crosslink. The unexposed areas of the photopolymerizable layer that were under the opaque regions of the transparency or in-situ mask during exposure do not crosslink or cure (i.e., harden). The uncured regions are soluble to solvents used during washout development and/or can melt, soften, or flow upon heating. The plate is then subjected to a processing step wherein the unexposed areas (i.e., uncured areas) are removed by treating with a washout solution or heat leaving a relief image suitable for printing. If treated with washout solutions, the plate is subsequently dried to remove solvents that may be absorbed by the plate. The printing plate can be further exposed to UV radiation to ensure complete polymerization and to remove surface tackiness. After all desired processing steps, the plate is then mounted on printing press to print the formed relief image onto a substrate.

Analog workflow requires the preparation of the phototool, which is a complicated, costly and time-consuming process requiring separate processing equipment and chemical development solutions. In addition, the phototool may change slightly in dimension due to changes in temperature and humidity. The same phototool, when used at different times or in different environments, may give different results. Since a phototool is created for each printing plate according to the color of ink being printed in a multicolor image, dimensional instability of the phototool can result in the mis-registration of multicolor images during printing. Use of a phototool also requires special care and handling when fabricating flexographic printing forms to ensure intimate contact is maintained between the phototool and plate. In particular, care is required in the placement of both the phototool and the plate in the exposure apparatus along with special materials to minimize air entrapment during creation of a vacuum to ensure intimate contact. Additionally care must be taken to ensure all surfaces of the photopolymer plate and phototool are clean and free of dust and dirt. Presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor capable of forming the in-situ mask in digital workflow are described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 5,607,814; U.S. Pat. No. 6,037,102; and U.S. Pat. No. 6,284,431. The precursor or an assemblage with the precursor includes a layer sensitive to infrared radiation and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is exposed through the in-situ mask to actinic radiation in the presence of atmospheric oxygen (since no vacuum is needed). Furthermore, due in part to the presence of atmospheric oxygen during main exposure the flexographic printing form has a relief structure that is different from the relief structure formed in analog workflow (based upon the same size mask openings in both workflows). Digital workflow results in the relief image having a different structure of the raised surface areas. In particular, the fine raised surface of dots (i.e., the individual elements of a halftone image) is typically smaller, with a rounded top, and a curved sidewall profile, which is often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. Oftentimes, nitrogen is mentioned as a suitable inert gas for the inert environment. The implication is that the nitrogen environment is one that contains substantially less than atmospheric oxygen to the extent that all oxygen is removed, or something less than about 10 ppm of oxygen. Nitrogen with oxygen impurity concentration level less than 10 ppm is readily commercially available.

A commercially important substrate for packaging graphics printing is corrugated paperboard. Corrugated paperboard includes a corrugating medium, which is a layer of pleated or multi-grooved paperboard typically called flute, adjacent a flat paper or paper-like layer referred to as liner. A typical embodiment of corrugated paperboard includes the flute layer sandwiched between two liner layers. Other embodiments of corrugated paperboard can include multiple layers of flute and liner. The fluted interlayer provides structural rigidity to the corrugated board. Since corrugated paperboard is used as packaging and formed into boxes and containers, the liner layer forming an exterior surface of the corrugated paperboard is frequently printed with the necessary identifying information for the package. The exterior liner layer often has slight indentations due to the uneven support of the underlying flute layer. A problem often encountered with printing onto corrugated board substrates is the occurrence of a printing effect that is typically referred to as fluting or banding, and can also be called striping or washboarding. Fluting typically occurs when post printing, that is printing the liner on the exterior surface of the corrugated paperboard, after the corrugated paperboard has been assembled. The fluting effect manifests as regions of dark printing, i.e., bands of higher density, alternating with regions of light printing, i.e., bands of lower (or less than high) density, that correspond to the underlying fluting structure of the corrugated board. The darker printing occurs where uppermost portions of the pleated interlayer structure support the printing surface of the liner. The fluting effect can be apparent in areas of a printed image having tones or tint values where the inked areas represent a fraction of the total area, as well as, in areas of the printed image where the ink coverage is complete or a solid. However, this fluting effect is found to be more pronounced when printing with a relief printing form that was produced using the digital workflow.

So a need arises for a modified process and apparatus for preparing relief printing forms from a photosensitive element (precursor) that is easy to use which provides printing forms having a relief structure similar to or better than the printing forms of the analog workflow process, and mitigates the disadvantages of the conventional digital workflow process, particularly, those resulting from the presence of oxygen during exposure to actinic radiation.

SUMMARY OF THE INVENTION

The present invention provides a method for preparing a relief printing form from a photosensitive element, comprising the steps of:

(a) forming an in-situ mask adjacent to a photopolymerizable layer in the photosensitive element, wherein the photosensitive element comprises the photopolymerizable layer containing a binder, an ethylenically unsaturated compound, and a photoinitiator;

(b) enclosing the photosensitive element in a closed exposure chamber;

(c) controlling the oxygen concentration within the closed exposure chamber in a range between 190,000 ppm and 100 ppm; and (d) exposing the photosensitive element to actinic radiation through the in-situ mask.

The present invention further provides an apparatus for exposing a photosensitive element to actinic radiation in an environment having a concentration of oxygen less than atmospheric oxygen, comprising:

(a) a closed exposure chamber comprising an inlet for introducing an inert gas or a mixture of gases into the closed exposure chamber, an outlet for removing oxygen from the closed exposure chamber, and having means for sealing the closed exposure chamber from an environment external to the closed exposure chamber;

(b) a source of actinic radiation located adjacent to the exposure chamber;

(c) a source for the inert gas or the mixture of gases, connected to the inlet; and (d) means for controlling oxygen concentration within the closed exposure chamber.

BRIEF DESCRIPTION OF THE DRAWINGS

FIG. 6A represents a curve of a cumulative sum of an area relative to height of a raised surface of a printing form prepared by analog workflow. FIG. 6B represents a curve of a cumulative sum of an area relative to height of a raised surface of a printing form prepared by conventional digital workflow (exposure in presence of atmospheric oxygen). FIG. 6C represents a curve of a cumulative sum of an area relative to height of a raised surface of a printing form prepared according to the present invention with a modified digital workflow in which exposure is an environment of an inert gas and a concentration of oxygen between 190,000 and 100 parts per million (ppm).

DESCRIPTION OF THE PREFERRED EMBODIMENTS

Figure 1:
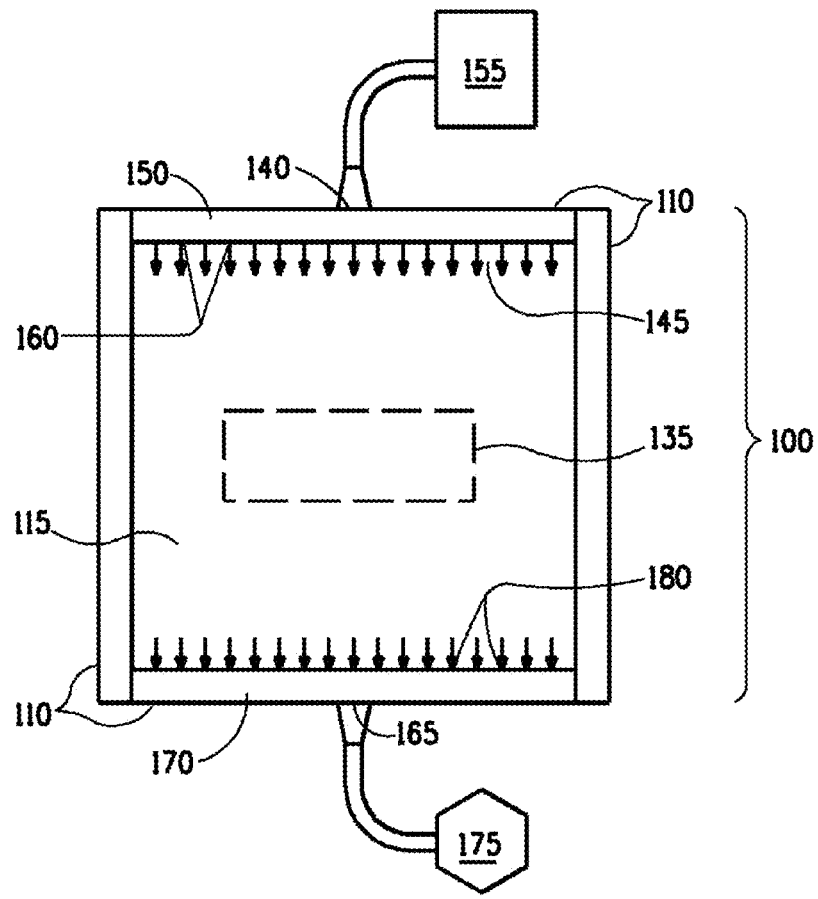
FIG. 1 is a schematic representation of a top planar view of one embodiment of an apparatus for exposing a photosensitive element in a closed exposure chamber capable of providing an environment having a concentration of oxygen less than atmospheric oxygen.

Throughout the following detailed description, similar reference characters refer to similar elements in all figures of the drawings.

The present invention is a method and an apparatus for preparing a relief printing form from a photosensitive element (i.e., precursor) that provides an improved relief structure on a relief printing form. The present invention is a modified digital workflow process that controls the concentration of oxygen during exposure of the photosensitive element to actinic radiation. The present invention has the ease and advantages of the conventional digital workflow process particularly for formation of an in-situ mask for the photosensitive element, while mitigating the disadvantages of conventional digital workflow process, particularly those resulting from the presence of atmospheric oxygen during exposure to actinic radiation. The present invention also provides the printing form with a relief structure similar to or better than a printing form prepared according to an analog workflow process.

GENERAL METHOD OF THE INVENTION

In a modified digital workflow process, a relief printing form is made from a photosensitive element having an in-situ mask. The photosensitive element is a photopolymerizable printing element having a layer of a photopolymerizable composition that includes binder, an ethylenically unsaturated compound, and a photoinitiator, on a support. The relief printing form has a pattern of printing areas that is formed by imagewise exposure of the photosensitive element to actinic radiation in an environment having an inert gas and a concentration of oxygen between 190,000 parts per million (ppm) and 100 ppm. Imagewise exposure of the photosensitive element in the environment having the inert gas and the particular oxygen content provides the printing form with a plurality of raised surfaces each with top surface area for carrying ink, a side-wall surface area, and a shoulder surface area that transitions between the top surface area and the side-wall surface area, and has a total printing area that is the sum of the top surface area and the shoulder surface area.

It has surprisingly and unexpectedly been found that controlling oxygen concentration during exposure can indirectly control the quantitative contribution of the shoulder surface area to the total printing area of the raised printing surface. This control has several process advantages. For example, in flexographic printing on substrates such as corrugated paperboard, it has surprisingly and unexpectedly been found that when the shoulder surface area increases a radius of the top printing surface area by less than or equal to about 10%, fluting or banding effect of an image printed by the relief printing form on corrugated paperboard is at least minimized. It has surprisingly and unexpectedly been found that when the shoulder surface area increases the radius of the top printing surface area by less than or equal to about 10 microns (for a 155 micron diameter dot raised surface), fluting or banding effect of an image printed by the relief printing form on corrugated paperboard is reduced. It has surprisingly and unexpectedly been found that a printing form prepared according to the present method provides a printing area of the raised surface in which the shoulder surface area increases a radius of the top printing surface area by less than or equal to about 2.5% significantly reduces fluting or banding effect of an image printed by the relief printing form on corrugated paperboard. It has been found that when the shoulder surface area represents less than 30%, preferably less than 10%, and most preferably less than 2% of the total printing area for printed dots in a mid-tone region of the tonal scale, fluting or banding effect of an image printed by the relief printing form on corrugated paperboard is at least minimized. This shoulder surface area can surprisingly be achieved when producing a digital plate in an environment having a concentration of oxygen less than atmospheric but greater than an environment that is completely free of oxygen or greater than an environment composed completely of an inert gas.

The present invention provides a relief printing form with the capability for improved printing image quality on corrugated paperboard over relief printing forms made by conventional methods of digital workflow, and even analog workflow. The present invention provides a relief printing form with a relief structure having raised surface elements that have a flat or substantially top printing surface and a sharp shoulder transition to a sidewall of the raised element. The present invention also avoids the cost and production disadvantages associated with analog workflow, and capitalizes on the efficiencies of digital workflow while avoiding the difficulty of establishing a completely inert environment. The present invention may also provide improvements in the printing performance of the printing form for long-term printing runs by reducing the potential for dot chipping, i.e., where raised printing surfaces wear or break off from the printing form.

The In-Situ Mask

A method for providing a relief printing form from a photosensitive element includes forming an in-situ mask adjacent the photopolymerizable layer, exposing the photopolymerizable layer to actinic radiation through the mask in an environment having an inert gas and a concentration of oxygen between 190,000 and 100 parts per million (ppm), and treating to form the relief printing form having a pattern of printing areas. An environment having an inert gas and a concentration of oxygen less than 100 ppm can be achieved and can provide the desired result in the printing surface of the printing form, but is not commercially practical since the period of time needed to purge and create the environment with the inert gas and oxygen concentration less than 100 ppm can significantly extend production. The atmospheric environment includes about 21% oxygen, about 78% nitrogen, and about 1% other gases. In most embodiments, the atmospheric environment typically surrounding the photosensitive element is purged or substantially purged with an inert gas and results in an environment (for imagewise exposure of the photosensitive element) that has the inert gas and the concentration of oxygen between 190,000 and 100 parts per million (ppm).

The photosensitive element includes a layer of a photopolymerizable material composed of at least a binder, an ethylenically unsaturated compound, and a photoinitiator, on or adjacent a support. The photosensitive element for use in the present invention is not limited, provided that the photosensitive element is capable of having an in-situ mask on or adjacent the photopolymerizable layer. The in-situ mask is an image of opaque areas and transparent areas that is integral or substantially integral with the photosensitive element for imagewise exposure to actinic radiation, and does not need vacuum to assure contact of the mask to the photopolymerizable layer. The in-situ mask avoids the drawbacks associated with generating a separate phototool and using vacuum to assure contact of the phototool to the photosensitive layer when making the relief printing form. Exposure of the photosensitive element having in-situ mask in an environment having an inert gas and a concentration of oxygen between 190,000 and 100 parts per million (ppm) may be referred to herein as a "modified digital workflow".

The in-situ mask image is formed on or disposed above the surface of the photopolymerizable layer opposite the support. The mask is an image that includes opaque areas and transparent or "clear" areas. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The mask image of the photosensitive element ultimately creates the pattern of printing areas for the relief printing form. The in-situ mask can be generated by any suitable method, including digital direct-to-plate methods using laser radiation (often referred to as digital methods or digital workflow), and inkjet application, that is conducted prior to imagewise exposure of the photosensitive element to actinic radiation. In digital direct-to-plate image technology, laser radiation is used to form the in-situ mask of the image for the photosensitive element. Generally, digital methods of in-situ mask formation use the laser radiation to either selectively remove or transfer a radiation opaque layer from or to a surface of the photosensitive element opposite the support. In most embodiments, the presence of the in-situ mask on the photosensitive element does not act as a barrier to oxygen for the photopolymerizable layer. In one embodiment, the photosensitive element does not include a barrier layer to the oxygen environment.

In one embodiment, the photosensitive element initially includes an actinic radiation opaque layer disposed on or above a surface of the photopolymerizable layer opposite the support, and laser radiation imagewise removes, i.e., ablates or vaporizes, the radiation opaque layer to form the in-situ mask. Only the portions of the radiation opaque layer that were not removed from the photosensitive element will remain on the element to create the mask. In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support. The assemblage is exposed imagewise with laser radiation to selectively transfer or selectively alter the adhesion balance of the radiation opaque layer and form the mask image on or disposed above the photopolymerizable layer. In this embodiment, only the transferred portions of the radiation opaque layer reside on the photosensitive element forming the in-situ mask. In another embodiment, digital mask formation can be accomplished by imagewise application of the radiation opaque material in the form of inkjet inks on the photosensitive element. Imagewise application of ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support.

In some embodiments, the laser radiation used to form the mask is infrared laser radiation. The infrared laser exposure can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask images remain on the photosensitive element for the subsequent step of overall exposure to actinic radiation (and treating).

Oxygen-Controlled Environment

The next step of the method to prepare a relief printing form is to overall expose the photosensitive element to actinic radiation through the in-situ mask, that is, imagewise exposure of the element. Imagewise exposure of the photosensitive element to actinic radiation is conducted in an environment that includes the presence of an inert gas and an oxygen concentration of between 190,000 to 100 part per million (ppm). The inert gas is a gas that exhibits no or a low reaction rate with the photosensitive element (that is, inert to the polymerization reaction), and is capable of displacing oxygen in the exposure environment (i.e., closed exposure chamber). Suitable inert gases include, but are not limited to, argon, helium, neon, krypton, xenon, nitrogen, carbon dioxide, and combinations thereof. Although the inert gas and combinations or mixtures of inert gases may include a small portion of oxygen, the presence of the small portion of oxygen does not significantly alter the capability of the inert gas to replace the atmospheric air in the chamber or to maintain the desired oxygen concentration in the chamber. In one embodiment, the inert gas is nitrogen.

Imagewise exposure of the photosensitive element in the particular environment of inert gas and oxygen concentration between 190,000 and 100 ppm creates in the printing form a relief structure of a plurality of raised surfaces each having a ink carrying top surface area that is structurally similar to an ink carrying top surface area created in a printing form that was prepared with analog workflow. That is, the top surface area of the raised surfaces in the relief printing form prepared according to the present method is flat or substantially flat, and not rounded as is typical of conventional digital workflow wherein the element is exposed in the presence of atmospheric oxygen. Conventional digital workflow methods imagewise expose the photosensitive element to actinic radiation in air under normal atmospheric conditions, which is 78% nitrogen, ~21% oxygen, <1% each argon and carbon dioxide, and trace amounts of other gases. In other words, the concentration of oxygen is about 210,000 ppm when the imagewise exposure is in air. In one embodiment, the photosensitive element does not include any additional layers on top of the in-situ mask, which additional layers may act as a barrier to the environment to the surface being imagewise exposed.

Closed Exposure Chamber

In one embodiment, the invention is a device or apparatus for exposing a photosensitive element to actinic radiation in an environment having a concentration of oxygen less than atmospheric oxygen. The device includes a closed exposure chamber, a source of actinic radiation, a source of gas for introduction to the closed exposure chamber, and a means for controlling the concentration of oxygen within the closed exposure chamber.

The closed exposure chamber includes an inlet for introducing a gas or a mixture of gases into the closed exposure chamber, an outlet for removing oxygen and/or gas from the closed exposure chamber, and means for sealing the closed exposure chamber from an environment external to the closed exposure chamber. The source of actinic radiation is capable of impinging the actinic radiation on a side of the photosensitive element having the in-situ mask while the photosensitive element resides in the closed exposure chamber. The source of actinic radiation can be located adjacent to the photosensitive element. In some embodiments, the source of actinic radiation is located adjacent the closed exposure chamber. The source of the gas, which can include a mixture of gases, is connected to the inlet of the closed exposure chamber. The means for controlling the oxygen concentration within the closed exposure chamber encompasses active embodiments in which the concentration of oxygen is measured at least prior to the initiation of exposure, and can continue to be measured during exposure; and passive embodiments in which the concentration of oxygen at any time after the introduction of the inert gas to the closed exposure chamber is based upon a predetermined set of conditions associated with the exposure chamber assembly. In active embodiments, the means for controlling the oxygen concentration includes least one oxygen meter connected to the outlet or to the closed exposure chamber for monitoring the oxygen content of the internal environment prior to, and optionally during, exposure of the photosensitive element. In passive embodiments, the concentration of oxygen is not actively measured or monitored prior to or during exposure of the photosensitive element, and the means for controlling the concentration of oxygen within the closed exposure chamber is based upon a predetermined set of conditions that can be established experimentally. During imagewise exposure of the photosensitive element, the photosensitive element is encased or substantially encased within the closed exposure chamber, such that the closed exposure chamber has an internal environment that is different during exposure from an environment external to the closed exposure chamber. The internal environment in the closed exposure chamber is a particular environment of a gas or gases, i.e., inert gas, and a concentration of oxygen between 190,000 ppm and 100 ppm. The closed exposure chamber encloses the photosensitive element in the internal environment during exposure so as to control or maintain the oxygen concentration in the exposure chamber. The closed exposure chamber can be sealed from the external environment by means for sealing, such as gaskets, and adhesive tape. However, sealing does not necessarily mean an airtight seal or a hermetic seal. Airtight seals and hermetic seals are included in embodiments of the present invention, however. The means for sealing the closed exposure chamber sufficiently seals the chamber from the external environment provided that the internal environment of the closed exposure chamber is controlled or maintained to have the oxygen concentration between 190,00 ppm and 100 ppm with the inert gas. The chamber also includes at least one inlet for introducing a gas or mixture of gases from a source into the chamber, and at least one outlet for removing air, including oxygen, as well as the introduced gas or gases from the chamber. The closed exposure chamber can be a separate enclosure appended within or mounted to an existing exposure apparatus, or can be incorporated into the frame of an exposure apparatus, or can be formed from an existing structure integrated in an exposure apparatus, such as a housing. In one embodiment, the closed exposure chamber is an integral part of an exposure apparatus, such that the exposure apparatus can accommodate all workflows, that is, analog workflow process with exposure under vacuum, conventional digital workflow with exposure in air, and modified digital workflow with exposure in the environment of inert gas and oxygen concentration between 190,000 and 100 ppm.

In one embodiment, the closed exposure chamber includes at least one wall and a roof attached to the at least one wall. In another embodiment, the closed exposure chamber comprises four walls and a bottom floor and a top roof. In another embodiment, the closed exposure chamber includes four walls and a top roof, which mates with or can be mounted on a planar support, i.e., an exposure bed, in an exposure apparatus having the source of actinic radiation to form a floor or bottom for the chamber. The at least one wall has a height sufficient to accommodate the photosensitive element within the chamber such that the roof does not contact or substantially contact a side of the photosensitive element with the in-situ mask. In some embodiments, the height of the wall should be sufficient to create an open space for the internal environment above the in-situ mask, creating a blanket of the gas (or gases) and the controlled concentration of oxygen adjacent the in-situ mask. In some embodiments, the closed exposure chamber is sufficiently sized to accommodate all photosensitive printing elements of various sizes, shapes, and thicknesses. In other embodiments, the closed exposure chamber is sized appropriately to accommodate only one or a few sizes, shapes, or thicknesses of the photosensitive printing element. In some embodiments, the closed exposure chamber has a box-like shape to accommodate photosensitive elements that are planar or form printing plates. However, the shape of the closed exposure chamber is not limited and can include other shapes, such as cylinders, in order to accommodate the photosensitive element and its orientation in the exposure apparatus.

Depending upon the size of the closed exposure chamber that is needed to accommodate the photosensitive element, particularly for planar-shaped photosensitive elements, and the type of material and the thickness that is used to form the roof of the closed exposure chamber, it may be necessary to assure that the roof of the closed exposure chamber does not deflect in toward the internal environment of the chamber. The roof of the exposure chamber may deflect, i.e., flex, or bend, under its own weight in toward the internal environment of the chamber. It is contemplated that deflection of the roof toward the internal environment may restrict the open space above the in-situ mask on the element, disturb the flow of gas through and in the chamber, and possibly alter the concentration of oxygen experienced by all or portions of the photosensitive element, particularly adjacent the in-situ mask. In some cases the roof of the closed exposure chamber may deflect, flex, or bend to such an extent that the roof contacts the photosensitive element enclosed inside the chamber. In this case it is expected that the portion/s of the photosensitive element contacting the roof would not experience the same oxygen concentration from the internal environment as the portion/s of the photosensitive element not contacting the roof, and non-uniformity in the relief structure of the printing would result. To compensate for the possibility of the roof of the closed exposure chamber deflecting, bending or flexing into the internal environment of the closed exposure chamber, the roof may be bowed in the opposite orientation by any manner so as to form a vault above the photosensitive element. The vaulted roof is not limited, and can encompass one or more domes, arches, or even cambers bowed above a plane of the photosensitive element. The shape of the vault is not limited, and can include, for example, circular dome, cylindrical dome, elliptical dome, one or more semi-cylindrical domes or arches, etc. In some embodiments, the vaulted roof can have more than one dome, arch, or camber, which is particularly useful when the roof is formed with thin (sheet) materials. The degree of bowing of the vaulted roof is not limited. A vaulted roof may form one or more domes, for example, from about 0.125 to about 1.5 inch, above a plane formed at the intersection of the roof to the at least one wall and perpendicular to the at least one wall. The closed exposure chamber having a vaulted roof increases the overall rigidity of the chamber, the stiffness of which can be increased by increasing the bow of the vault. In most embodiments where the source of actinic radiation is external to the closed exposure chamber and the roof is sufficiently transparent to the actinic radiation, it is observed that the actinic radiation impinging upon the photosensitive element enclosed in the chamber is not influenced by the roof being vaulted, or by the bowing of the roof of the closed exposure chamber. In one embodiment, the closed exposure chamber may be manufactured to have a roof having a semi-cylindrical-domed shape by forming parallel sides of the roof to have a length that is longer than a length of the corresponding wall, and restricting the parallel sides of the roof to fit its corresponding wall.

The source of actinic radiation can be located within or outside the closed exposure chamber, provided that the source is capable of impinging the actinic radiation onto the side of the photosensitive element having the in-situ mask. The source of actinic radiation is or can be positioned adjacent the closed exposure chamber, and in particular is or can be positioned adjacent the photosensitive element. In particular, the source of actinic radiation should be located, positioned, or positionable such that the source can expose the photosensitive element through the in-situ mask while the element is enclosed in the chamber. The actinic radiation source can be from 1.5 inches to 60 inches from the photosensitive element.

In one embodiment, the source of actinic radiation is located internal to the closed exposure chamber. Thus, the closed exposure chamber wall/s and roof need not be transparent to the actinic radiation. In other words, the entire or some portion of the source assembly, i.e., the actinic radiation source, as well as the relief printing form precursor (the photosensitive element), are placed within the closed exposure chamber. This particular embodiment eliminates requirement for building the closed exposure chamber or parts thereof from a material or materials that are transparent or substantially transparent to actinic radiation and the need to compensate for the attenuation or absorbance of the actinic radiation by the material forming the closed exposure chamber by adjusting, i.e., lengthening or shortening, the time of exposure. For example, in one embodiment, a housing or cover used in a laser exposing apparatus for digitally imaging the in-situ mask with laser radiation as disclosed in U.S. Pat. No. 5,760,880 to Fan et al. can also serve as the closed exposure chamber for the imagewise exposure in the environment of the inert gas and oxygen concentration of 190,000 to 100 ppm. An example of a suitable commercially available laser exposing apparatus is the CYREL® Digital Imager. In this embodiment, the source of actinic radiation can be located within the housing and the photosensitive element can be mounted on a rotatable shaft or drum. The actinic radiation source located within the housing can be stationary or movable relative to the photosensitive element.

In another embodiment, the source of actinic radiation is located external to the closed exposure chamber. In this embodiment, at least the wall or roof that is adjacent to the side of the photosensitive element with the in-situ mask must be transparent or substantially transparent to the actinic radiation so that the actinic radiation can transmit through to the photosensitive element without appreciable scattering or absorbance. By "transparent" is meant that a sufficient amount of the actinic radiation is capable of transmitting through a side, i.e., wall or roof, of the chamber to impinge and expose the photosensitive element. In some embodiments, the material of the closed exposure chamber is transparent or substantially transparent if at least 4% of the actinic radiation transmits through a side of the chamber to impinge and expose the photosensitive element. In other embodiments, the material forming the chamber is transparent or substantially transparent if at least 45 to 65% of the actinic radiation transmits through a side of the chamber to impinge and expose the photosensitive element. In yet other embodiments, the material forming the chamber is transparent or substantially transparent if at least 65 to 99% of the actinic radiation transmits through a side of the chamber to impinge and expose the photosensitive element. It should be noted that exposure time may need to be adjusted, i.e., lengthened, in order to compensate for the attenuation or absorbance of the actinic radiation by the exposure chamber. It is well within the ordinary skill of those in the art to determine appropriate adjustments to exposure time. In this embodiment where the source of actinic radiation is positioned external to the closed exposure chamber, typically the roof of the closed exposure chamber is transparent to actinic radiation. In some embodiments, both the top roof and the bottom floor of the closed exposure chamber are transparent to actinic radiation. Materials suitable for use, and transparent, substantially transparent, or partly transparent to actinic radiation, e.g., ultraviolet radiation, include, but are not limited to, polycarbonates, such as polycarbonates sold with the brand name of Lexan®; acrylics, such as acrylics sold with the brand name of Plexiglas®, and Acrylite®; fluorocarbon resins, such as fluorocarbon resins sold with the brand name Teflon® FEP; and glass. The thickness of the material is not limited.

In addition to the closed exposure chamber, the apparatus for exposing the photosensitive element includes the means for controlling the concentration of oxygen in the internal environment in the range from 190,000 to 100 ppm. An active embodiment for controlling the oxygen concentration in the exposure chamber monitors the internal environment of the exposure chamber by measuring the oxygen concentration in or exiting the exposure chamber prior to, and optionally during, exposure of the photosensitive element. In some embodiments, the means for controlling the concentration of oxygen includes a means for measuring the concentration of oxygen that is coupled with the closed exposure chamber assembly to actively monitor the oxygen content within or exiting the closed exposure chamber. The means for measuring the oxygen concentration can be at least one oxygen meter that is connected to the outlet or to the closed exposure chamber. More than one oxygen meter may be necessary in order to monitor the concentration of oxygen over the entire range from 190,000 parts per million (ppm) to 100 ppm. An oxygen meter may be capable of measuring only a portion of the possible range of oxygen concentration suitable for the present invention. Monitoring the inert gas and the oxygen concentration in the internal environment with the means for measuring the oxygen concentration facilitates controlling the oxygen concentration, which can be maintained or changed during the exposure of the photosensitive element, as needed within the range of 190,000 to 100 ppm. In another embodiment the apparatus for exposing the photosensitive element in the environment having a concentration of oxygen less than atmospheric oxygen, further includes a feedback control between the oxygen meter and the gas source, so that the oxygen concentration is automatically monitored and controlled. It is expected that measurement of the concentration of oxygen at the outlet of the oxygen chamber is representative of the concentration of oxygen in the internal environment of the closed exposure chamber.

Figure 2:
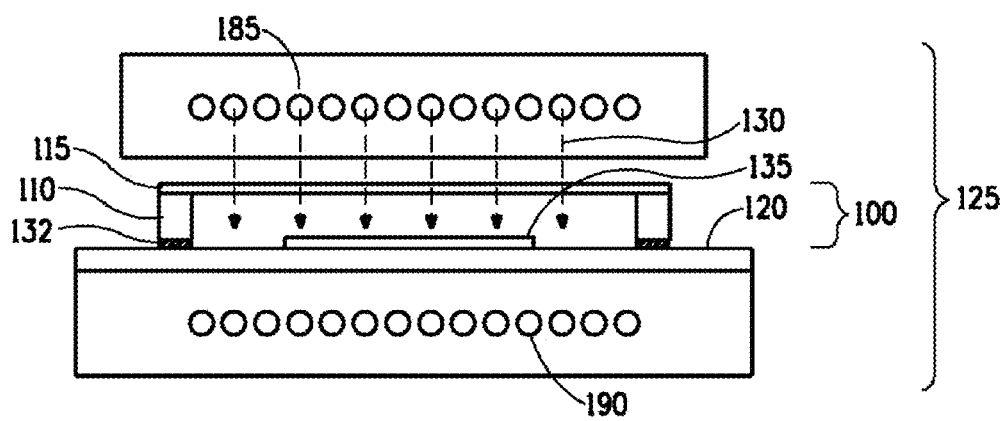
FIG. 2 is a schematic representation of a cross-sectional view of the embodiment of the apparatus having the closed exposure chamber shown in FIG. 1.

In other embodiments, the concentration of oxygen is not actively measured or monitored prior to or during exposure of the photosensitive element, and thus may be considered a passive embodiment. In passive embodiments, the means for controlling the concentration of oxygen within the closed exposure chamber is based upon a predetermined set of conditions that is established in most instances experimentally. One or more experimental tests are conducted that introduce the inert gas at a particular flow rate into a given closed exposure chamber having a known size or volume, and the concentration of oxygen in or exiting the chamber with time is measured. From the tests based upon the flow rate and time after introduction of the inert gas into the closed exposure chamber, one of ordinary skill in the art can predict when the internal environment of the exposure chamber has been purged sufficiently with the inert gas to have the oxygen concentration in the range of 190,000 to 100 ppm so that the exposure of the photosensitive element can begin. Thus, the means for controlling the concentration of oxygen in the closed exposure chamber can be accomplished based upon the predetermined set of conditions that includes at least the flow rate of the inert gas and the time after introduction of the inert gas into the exposure chamber. The flow rate of the inert gas entering the inlet port can be controlled by any suitable fluid flow means, such as a metering valve, flowmeter, or mass flow meter. Such that in the passive embodiment, the means for controlling the concentration of oxygen includes means for metering the inert gas at the flow rate for a time sufficient for the oxygen concentration to be in a range of 190,000 to 100 ppm. The flow rate of the inert gas into the chamber can be maintained or can be changed (i.e., increased, decreased, and/or stopped) from the flow rate used initially to purge the chamber provided that testing has assured that the concentration of oxygen in the closed exposure chamber is between 190,000 to 100 ppm while the photosensitive element is exposed to the actinic radiation. The time of the exposure of the photosensitive element to actinic radiation may also influence the predetermined conditions to assure that the oxygen concentration in the closed exposure chamber is between 190,000 to 100 ppm. FIGS. 1 and 2 show an embodiment wherein the photosensitive element is placed inside a closed exposure chamber 100 of an apparatus 125 for exposing the photosensitive element to actinic radiation, and wherein a source of actinic radiation is external to the closed exposure chamber 100. The closed exposure chamber 100 has a roof 115 that is transparent to actinic radiation and is adapted for placement on a bed of the exposure apparatus 125. FIG. 1 shows a schematic top view of one embodiment of the closed exposure chamber 100, and FIG. 2 shows a schematic cross-sectional view of the closed exposure chamber 100 mounted on the exposure bed 120.

Figure 10:
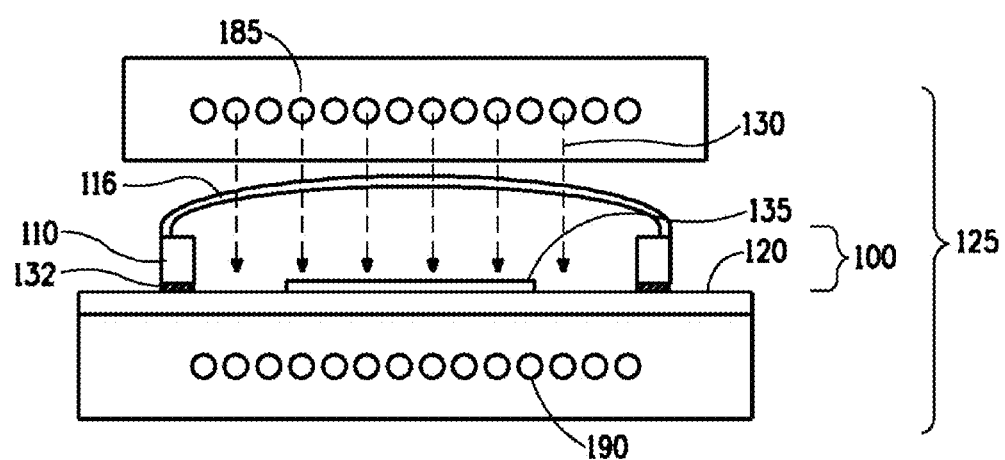
FIG. 10 is a schematic representation of a cross-sectional view of the embodiment of the apparatus having the closed exposure chamber shown in FIG. 1 but having a vaulted roof.

As shown in FIGS. 1 and 2, the closed exposure chamber 100 includes a four-sided box 110 of walls and having a top side or roof 115, which can be mounted on the exposure bed 120 of a standard flat-bed exposure frame apparatus 125. The exposure bed 120 completes the enclosure of the dosed exposure chamber 100, which allows for creating the desired internal environment for the photosensitive element residing on the bed 120 and encased within the chamber 100. The roof 115 can be made of clear material, i.e., material transparent to actinic radiation, and the walls can be made of any material suitable to support the roof 115. In one embodiment, the roof 115 is made of FEP Teflon®, and the walls are tubular metal. In another embodiment, the roof 115 and the walls are made of Lexan® polycarbonate. In another embodiment, the roof 115 is made of Acrylite® OP-4 ultraviolet transmitting acrylic (from Cyro Industries, Orange, Conn.) and the walls are stainless steel. In another embodiment, the roof can be vaulted 116 as shown in FIG. 10.

The roof 115 through which the actinic radiation 130 (not shown in the FIG. 1, but it would be perpendicular into the plane of the paper) impinges on the photosensitive element 135, is transparent to the actinic radiation 130. At least 4% of the actinic radiation transmits through the roof 115. Within the closed exposure chamber 100 and on top of the exposure bed 120 is placed the photosensitive element 135 that receives the actinic radiation 130. The photosensitive element 135 is positioned on the bed 120 so that the side of the element having the in-situ mask faces the source of actinic radiation 130.

Depending upon the material suitable for forming the closed exposure chamber 100, exposure time of the actinic radiation 130 may be lengthened (or shortened) to compensate for the difference in transparency between different materials used for making the closed exposure chamber 100. For example, the exposure time is lengthened to compensate for the ultraviolet radiation absorption characteristics of the Lexan® material. The side-walls 110 of the closed exposure chamber 100 can be made of any material that provides structural stability to the closed exposure chamber 100 and is amenable to sealing of the closed exposure chamber 100, such as plastic or metal or wood. The side-walls 110 can be, but need not be, transparent to actinic radiation 130. The closed exposure chamber 100 can be sealed from external environment (i.e., room conditions) through a sealing gasket 132, which is secured to an end of the wall adjacent or adjoining the exposure bed 120. The closed exposure chamber 100 includes an inlet port 140 for introducing the gas 145 into the closed exposure chamber 100, through a gas input manifold 150. In one embodiment, the seal 132 is not an airtight seal. In FIG. 1, the flow of gas 145 is represented by the arrows.

In one embodiment, the gas 145 is an inert gas or mixture of inert gases. The inert gas 145 is provided from an inert gas source 155 and into the gas input manifold 150 from which the gas 145 enters the closed exposure chamber 100 through the gas input holes 160. The closed exposure chamber 100 also has an outlet port 165 attached to the gas output manifold 170 for purging some or most of the air that is initially present in the closed exposure chamber 100 in order to provide the internal environment of the closed exposure chamber with an oxygen concentration between 190,000 to 100 ppm. In another embodiment, the gas 145 introduced in the internal environment of the closed exposure chamber 100 is an inert gas or mixture of inert gas and oxygen. In this embodiment, it may be desirable to maintain the concentration of oxygen to a particular set point or steady state within the range of 190,000 to 100 ppm, which can be easier accomplished by the introduction of oxygen with the inert gas/es, than alone by the purging of the oxygen in the air with inert gas. In this embodiment, an oxygen meter 175 for measuring the concentration of oxygen within the closed exposure chamber 100 may be located at the outlet port 165. The oxygen meter 175 provides the concentration of oxygen in the gas 145 exiting the gas output manifold 170 through the gas exit holes 180 and into the outlet port 165. Based on the reading of the oxygen meter 175, the flow of gas 145 can be monitored manually. The oxygen meter 175 can also be looped in an automatic feedback mechanism to the gas inlet port 140 to control the oxygen concentration inside the closed exposure chamber 100 to a desired concentration.

In an alternate embodiment, the control of the concentration of oxygen in the closed exposure chamber is predetermined based upon prior testing of the chamber. One or more test trials are conducted on a closed exposure chamber having an established size by introducing the inert gas at a flowrate into the chamber and measuring the concentration of oxygen with a (removable) oxygen meter over a period of time. The photosensitive element may be present or not inside of the closed exposure chamber. From the trial tests, one of ordinary skill can determine the time necessary to purge the closed exposure chamber of atmospheric oxygen with a given flowrate of the inert gas, to attain an internal environment of the inert gas and a concentration of oxygen between 190,000 and 100 ppm, and at which time exposure of the photosensitive element can begin. In this alternate operating embodiment (not shown), the closed exposure chamber does not include the oxygen meter, but includes a metering valve with the source of the inert gas for determining the flow rate of the inert gas into the chamber. In a preferred embodiment, the actinic radiation source 185 is placed external to the closed exposure chamber 100. The photosensitive element 135 is exposed to the radiation 130 passing through the transparent roof 115. In FIG. 2, arrows originating from the source of actinic radiation 185 represent the actinic radiation 130 impinging the photosensitive element 135 through the roof 115. In one embodiment, the actinic radiation source 185 is attached to the closed exposure chamber. In another embodiment, the actinic radiation source 185 is not attached to the closed exposure chamber 100. In another embodiment, a second optional actinic radiation source 190 is placed at the bottom of the exposure bed 120 in the apparatus 125. This optional actinic radiation source 190 can be used for backflash or floor creation in the photosensitive element 135. The optional actinic radiation source 190 can be attached to the exposure frame 125 or it may not be attached to the exposure frame 125. When the optional actinic radiation source 190 is used, the exposure bed 120 is transparent to actinic radiation.

It should be understood that one of ordinary skill in the art could modify commercially available exposure apparatus to accommodate the closed exposure chamber of the present invention. Various commercial apparatuses suitable for exposing the photosensitive element to actinic radiation are available from suppliers to the printing industry. Some examples of exposure apparatuses include the CYREL® 3000 E-TL, the CYREL® FAST 1000EC/LF, and the CYREL® FAST 2000EC/LF, which are available from The Du Pont Company (Wilmington, Del.). The photosensitive element in these commercial apparatuses is placed on a planar support surface, i.e., bed, for exposure, and as such, the exposure apparatus would accommodate a closed exposure chamber that is the same, or substantially the same, or a similar to the embodiment of the closed exposure chamber shown in FIGS. 1 and 2. Exposure apparatuses for cylindrically-shaped photosensitive elements are also commercially available, and could readily be appropriately modified to form a closed exposure chamber by one of ordinary skill in the art. Commercial exposure apparatuses can be modified temporarily or permanently with the installation of a kit containing the components to form the closed exposure chamber. In some embodiments, the concentration of oxygen in the internal environment of the closed exposure chamber is controlled at a steady rate of reduction in a range of oxygen concentration between 190,000 ppm to 100 ppm. In other embodiments, the concentration of oxygen in the internal environment of the closed exposure chamber is controlled at a variable rate of reduction in a range of oxygen concentration between 190,000 ppm to 100 ppm. In most embodiments, the internal environment of the closed exposure chamber is initially purged of the air having a nominal oxygen concentration of 210,000 ppm with the inert gas/es until the oxygen concentration in the chamber is about 190,000 ppm or less and control of the oxygen concentration in the chamber is necessary. In one embodiment, the oxygen concentration is controlled by reducing the oxygen concentration from the closed exposure chamber at a steady rate of reduction or at a variable rate of reduction, starting from oxygen concentration of about 190,000 ppm to 100 ppm. In another embodiment, the oxygen concentration is controlled by reducing the oxygen concentration from the closed exposure chamber at a steady rate of reduction or at a variable rate of reduction, starting from an oxygen concentration at 210,000 ppm and maintaining the oxygen concentration in between 190,000 ppm to about 100 ppm. Oxygen concentration (in terms of partial pressure of oxygen in the closed exposure chamber) is reduced by introduction of inert gas or a mixture of inert gases as described previously.

In some embodiments, the exposure of the photosensitive element to actinic radiation begins after a steady state level of oxygen concentration is reached in the closed exposure chamber and continues on for a specified time in order to crosslink or harden the exposed areas of the photopolymerizable layer. In other embodiments, exposure of the photosensitive element to actinic radiation begins before a steady state level of oxygen concentration is reached in the closed exposure chamber and continues on for a specified time after the steady state is reached. The steady state concentration of oxygen in the closed exposure chamber is maintained in the range of from about 190,000 ppm to about 100 ppm. The steady state oxygen concentration can be, for example, the following numbers, measured in parts per million (ppm). It can also be within ranges defined by any two of the following ppm numbers: 100; 200; 300; 400; 500; 600; 700; 800; 900; 1000; 2000; 3000; 4000; 5000; 6000; 7000; 8000; 9000; 10,000; 15,000; 20,000; 25,000; 30,000; 35,000; 40,000; 45,000; 50,000; 55,000; 60,000; 65,000; 70,000; 75,000; 80,000; 85,000; 90,000; 95,000; 100,000; 105,000; 110,000; 115,000; 120,000; 125,000; 130,000; 135,000; 140,000; 145,000; 150,000; 155,000; 160,000; 165,000; 170,000; 175,000; 180,000; 185,000; and 190,000. In other embodiments, oxygen concentration is maintained at more than one steady state defined by the numbers above.

In other embodiments of the present invention, oxygen concentration in the internal environment of the exposure chamber is continuously reduced from about 190,000 ppm to about 100 ppm. Exposure of the photosensitive element to actinic radiation begins at any intermediate points of oxygen concentration in the range of 190,000 ppm to 100 ppm, and continues as the concentration of oxygen reduces inside the closed exposure chamber. Actinic radiation can begin at an oxygen concentration defined by any of the following numbers measured in ppm: 100; 200; 300; 400; 500; 600; 700; 800; 900; 1000; 2000; 3000; 4000; 5000; 6000; 7000; 8000;

9000; 10,000; 15,000; 20,000; 25,000; 30,000; 35,000; 40,000; 45,000; 50,000; 55,000; 60,000; 65,000; 70,000; 75,000; 80,000; 85,000; 90,000; 95,000; 100,000; 105,000; 110,000; 115,000; 120,000; 125,000; 130,000; 135,000; 140,000; 145,000; 150,000; 155,000; 160,000; 165,000; 170,000; 175,000; 180,000; 185,000; and 190,000.

The improved effect on the shape of the raised surface elements, i.e., a more analog-like dot with flat top and sharp shoulders, is observed in photosensitive elements that are imagewise exposed in an internal environment in which the oxygen concentration begins at 190,000 ppm and continually reduces. However, the improved effect on the raised surface element shape is particularly pronounced in photosensitive elements that are imagewise exposed in an internal environment in which the oxygen concentration is less than about 20,000 ppm to 100 ppm. In some embodiments, the improved effect on the raised surface element shape can be observed in photosensitive elements in which the imagewise exposure begins when the internal environment has oxygen concentration less than about 20,000 ppm and, is continually reduced or is maintained at a steady state less than about 20,000 ppm. In other embodiments, the improved effect on the raised surface element shape can be observed in photosensitive elements in which at least about 30% of the total imagewise exposure time is conducted in the internal environment having the oxygen concentration of less than 20,000 ppm, and in particular less than 1000 ppm. In yet other embodiments, the improved effect on the raised surface element shape can be observed in photosensitive elements in which at least about 65% of the total imagewise exposure time is conducted in the internal environment having the oxygen concentration of less than 20,000 ppm. In yet other embodiments, the improved effect on the raised surface element shape can be observed in photosensitive elements in which at least about 45% of the total imagewise exposure time is conducted in the internal environment having the oxygen concentration of less than or equal to 5,000 ppm.

In some embodiments, after the oxygen concentration has reached 190,000 ppm or less in the closed exposure chamber, the concentration of oxygen is continually reduced during imagewise exposure by continuous introduction of the inert gas into the closed exposure chamber. Imagewise exposure can begin when the concentration of oxygen is at or below 190,000 ppm (19%), and continue as the oxygen concentration reduces to less than or equal to 5000 ppm. In other embodiments, imagewise exposure can begin when the oxygen concentration is 1000 ppm and continue until the oxygen concentration reaches about 100 ppm.

In some embodiments, the internal environment for the photosensitive element during exposure has a concentration of oxygen that is an average of the oxygen concentration at the start of the imagewise exposure and the oxygen concentration at the end of the imagewise exposure.

In other embodiments, the internal environment for the photosensitive element during imagewise exposure has a concentration of oxygen that is a weighted average of the oxygen concentration based on the percentage of time of the total exposure time.

In some embodiments, the internal environment has an average oxygen concentration of less than or equal to 80,000 ppm. In other embodiments, the environment has an average oxygen concentration of less than or equal to 30,000 ppm. In yet another embodiment, the average oxygen concentration is less than or equal to any of the following ppm numbers: 100; 200; 300; 400; 500; 600; 700; 800; 900; 1000; 2000; 3000; 4000; 5000; 6000; 7000; 8000; 9000; 10,000; 15,000; 20,000; 25,000; 30,000; 35,000; 40,000; 45,000; 50,000; 55,000; 60,000; 65,000; 70,000; 75,000; and 80,000.

As described previously, in some embodiments after the oxygen concentration has reached 190,000 ppm or less in the closed exposure chamber, the oxygen concentration in the closed exposure chamber is maintained or substantially maintained by closing inlet and outlet ports. Oxygen concentration can be controlled by having two gas sources from which gases are fed and mixed into a manifold that feeds the mixed gas into an inlet port.

Actinic Radiation

The photosensitive element of the present invention is exposed through the mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° C. to about 35° C. Exposure is of sufficient duration to crosslink the exposed areas down to the support or to the back exposed layer, i.e., floor. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, content fluorescent lamps, electron flash units, electron beam units, lasers, and photographic flood lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. In some embodiments, a mercury vapor arc or a sunlamp can be used. In other embodiments, a high-ultraviolet content fluorescent lamp can be used at a distance of about 1 to about 10 inches (about 2.54 to about 25.4 cm) from the photosensitive element. These radiation sources generally emit long-wave UV radiation between 310-400 nm.

In some embodiments, the method to make the relief printing form includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. In some embodiments, a floor for may be included in the photosensitive element when the photosensitive element is produced, and so a separate backflash exposure may not be necessary.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. In some embodiments of the photosensitive elements having an in-situ mask, the treating step also removes the mask image (which had been exposed to actinic radiation) and the underlying unexposed areas of the photopolymerizable layer.

Development Processes-Treatment

Treating of the photosensitive element includes (1) "wet" development wherein the photopolymerizable layer is contacted with a suitable developer solution to washout unpolymerized areas and/or (2) "dry" development wherein the photosensitive element is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development can be carried out at room temperature but usually is carried out at about 80 to 100° F. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary based on the thickness and type of the photopolymerizable material, the solvent being used, and the equipment and its operating temperature, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary based on equipment design, air flow, plate material, however, typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the photosensitive element includes one or more additional layers on the photopolymerizable layer, it is desirable (but necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

Apparatuses suitable for thermally developing the photosensitive element are disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out.

The photosensitive element in all embodiments is in the form of a plate. However, it should be understood that one of ordinary skill in the art could modify each of the disclosed apparatuses to accommodate the mounting of the photosensitive element in the form of a cylinder or a sleeve.

The development medium is selected to have a melt temperature exceeding the melt or softening or liquefying temperature of the unirradiated or uncured portions of the radiation curable composition and having good tear resistance at the same operating temperatures. The selected material withstands temperatures required to process the photosensitive element during heating. The development medium may also be referred to herein as development material, absorbent material, absorbent web, and web. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. In some embodiments, the development medium is a non-woven web of nylon or a non-woven web of polyester.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

Relief Printing Form

The relief printing form provides a relief structure that includes a plurality of raised surfaces from the floor, where each of the raised surfaces has an ink-carrying top surface area. The relief printing form produced by the modified digital workflow in the environment having an inert gas and an oxygen concentration of between 190,000 ppm and 100 ppm, provides a shape to the raised surfaces that is similar to the shape of the raised surfaces produced by conventional analog workflow, i.e., imagewise exposure through a phototool film held in contact by vacuum. The present method of a modified digital workflow, in which the photosensitive element is imagewise exposed through an in-situ mask in the presence of an inert gas and an oxygen concentration of 190,000 ppm to 100 ppm, generates a shape to the raised surfaces that is 'analog like' structure, i.e., a raised surface having a flat top and sharp shoulders. In some embodiments, the modified digital workflow provides a shape to the raised surfaces that also minimizes the fluting effect when used to print on substrates such as corrugated paperboard. The shape of the raised surfaces is determined by the ink carrying top surface area, a side-wall surface area, and a shoulder surface area which is the transition between the top surface area and the side-wall surface area. For each raised surface, the total printing area capable of contacting the substrate to transfer the ink is the sum of the top surface area and the shoulder surface area, and relates to the pressure between the substrate and the relief printing form.

In the present invention for raised surfaces having a dot area of about 30% of a total pixel area (based on the screen resolution of the image), the shape of the raised surface is such that the ink transferred to the substrate under pressure by the shoulder surface area is less than or equal to 30% of the total printing area. The fluting effect is reduced as the contribution of the shoulder area to the total printing area is reduced. In some embodiments, the ink transferred to the substrate by the shoulder surface area is less than or equal to 25% of the total printing area. In other embodiments, the ink transferred to the substrate by the shoulder surface area is less than or equal to 20% of the total printing area. In some embodiments, the ink transferred to the substrate by the shoulder surface area is less than or equal to 15% of the total printing area. In some embodiments, the ink transferred to the substrate by the shoulder surface area is less than or equal to 10% of the total printing area. In some embodiments, the ink transferred to the substrate by the shoulder surface area is less than or equal to 5% of the total printing area.

While the shape of the raised surface is somewhat similar to the shape of the raised surface in relief printing forms made in analog workflow, that is, generally conical with a relatively flat ink carrying top surface area that sharply transitions through the shoulder to the side-wall surface area, the contribution by the shoulder surface area to the total printing area by the relief printing form of the present invention can be substantially different for the observed reduced level of fluting in the printed image.

Figure 3:
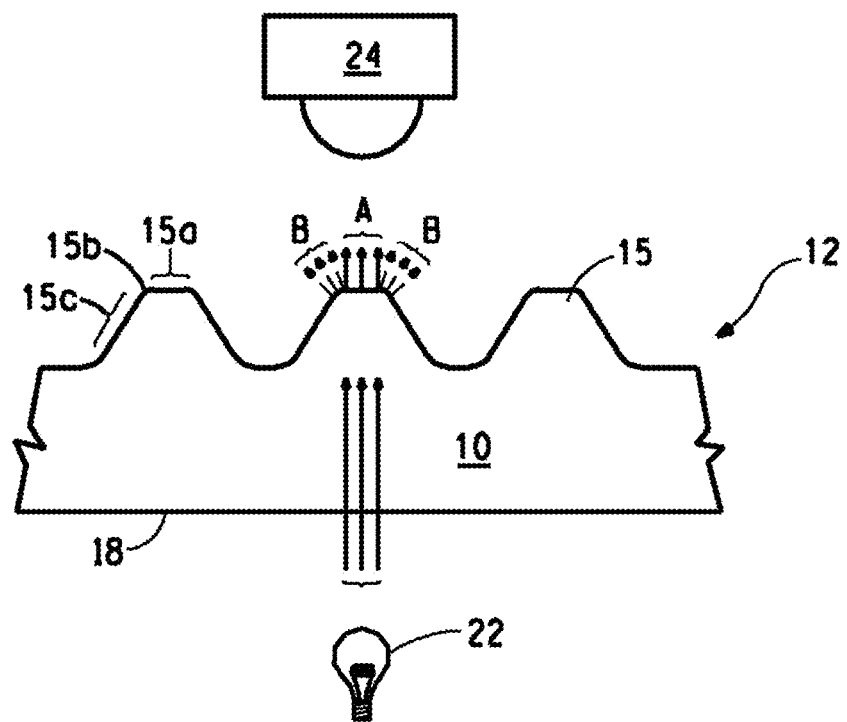
FIG. 3 is a schematic representation of a cross-section of a relief printing form having raised surfaces, in an optical device for determining an area of the raised surface.
Figure 3A:
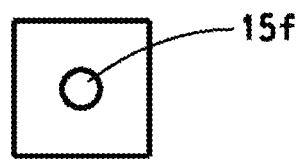
FIG. 3A is a schematic representation of an image taken by the optical device of the raised surface on the relief printing form.

Common imaging techniques, such as a microscope or optical devices, are used to determine the observed dot area. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality. As shown in FIG. 3, when utilizing the aforementioned optical devices, a plate 10 having a relief structure 12 of raised surfaces 15 is illuminated with a light source 22 from a bottom side 18 of the plate, and the light passes though the plate 10 to the microscope objective or optical device detector 24. The raised surface 15, typically referred to as dot structure, includes a flat portion 15a, a shoulder portion 15b, and a sidewall portion 15c. Due to the geometry of the raised surface 15, light passes, depicted as vector(s) A, through the flat portion 15a of the raised surface and is collected by the detector 24. Light striking the shoulder portion 15b and the sidewall portions 15c of the raised surface 15 of the relief structure 12, depicted as vector(s) B, are refracted away from the objective or detector 24. As a result, the observed or measured dot size of the raised surface 15 relates to the flat portion 15a of the dot structure. Other optical devices may illuminate and detect in an opposite manner, that is illuminate from the top side of the plate, and detect transmitted light on the opposite side of the plate, but the dot size measured is still the flat portion of the dot structure. FIG. 3A represents an image taken by the optical device of the flat portion 15a of the raised surface 15, showing the observed dot area 15f. While these types of optical measurements are accurate in determining the flat portion 15a of the relief printing surface, they do not accurately capture the shoulder portion 15b of the raised surface.

U.S. patent application Ser. No. 12/349,608 of common assignee describes the effect of modified digital workflow on substrates such as corrugate boards. It should be noted that the present invention discusses the corrugated board substrates only as an example to demonstrate the results of using digital workflow process, in which the oxygen concentration is controlled. The present invention can easily be used in conjunction with printing on other substrates.

In corrugated paperboard substrates, the printing surface of the raised surface 15 not only includes the flat portion 15a of the dot, but also at least a portion of the dot shoulder 15b. Thus, the effective dot area not only includes the observed dot area but some portion of the dot shoulder that is likely to come in contact with the substrate during printing. The shape of the dot shoulder 15b, that is the transition from the flat portion 15a to the sidewall portion 15c, influences the portion that will likely contact the substrate.

Assuming equal plate durometer, impression pressure, and substrate compliance, a comparison of printing onto corrugated board substrate using a relief printing form having raised surfaces with rounded shoulders relative to a relief printing form having raised surfaces with very sharp shoulders can be determined by considering the increase in printing surface as the pressure applied to the printing form increases.

Figure 4:
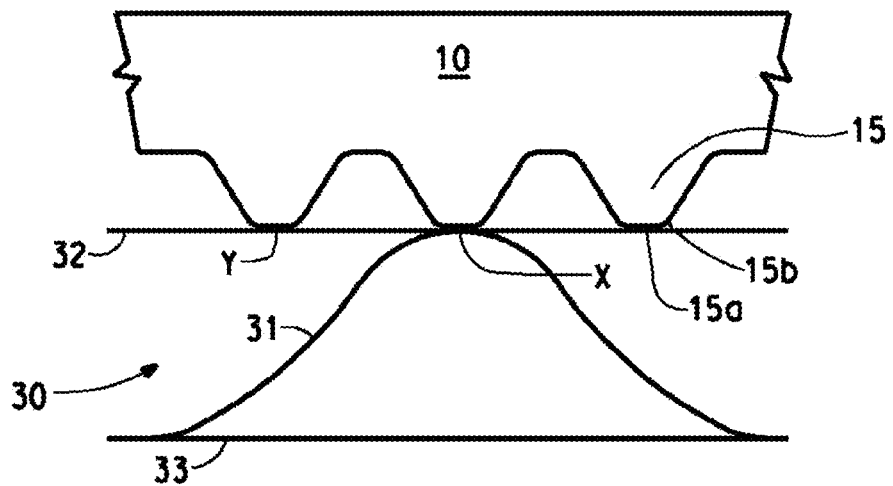
FIG. 4 is an elevation view of a relief printing plate having raised surfaces with dot shoulders that are rounded, and pressed against a corrugated board substrate.
Figure 4A:
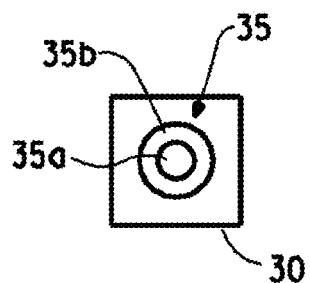
FIG. 4A is a schematic representation of a dot image of one of the raised surfaces having the rounded dot shoulders of FIG. 4, onto a supported portion of a corrugated board substrate.
Figure 4B:
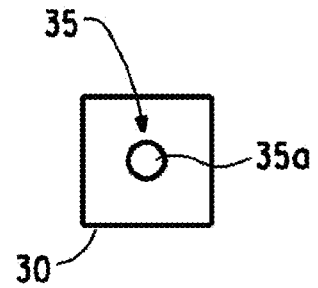
FIG. 4B is a schematic representation of a dot image of one of the raised surfaces having the rounded dot shoulders of FIG. 4, onto a non-supported portion of a corrugated board substrate.

FIG. 4 shows a relief printing plate 10 having raised surfaces 15 with dot shoulders 15b that are rounded, and pressed against a corrugated board substrate 30 having a fluted layer 31 between two liner layers 32, 33. At location X, the fluted layer 31 contacts the top liner layer 32 and provides additional support to the top liner layer 32. The support of the fluted layer 31 applies additional pressure to the printing structure causing more of the dot shoulder area to also transfer ink and creating an inked region on the corrugated substrate of area larger than the flat portion of the dot surface 15a. FIG. 4A represents the inked image 35 of the raised portion 15 in which the flat portion 15a and the rounded shoulder portion 15b transferred ink portions 35a and 35b onto the corrugated board substrate 30 at a location X. The ink image 35 observed would be a dot size of 15b. At location Y where the top liner layer 32 is not supported by fluted layer 31, less pressure is applied to the printing structure and the inked region 35a on the corrugated substrate 30 corresponds more directly to the to flat portion 15a of the printing surface. FIG. 4B represents the inked image 35 of the raised portion 15 in which the flat portion 15a transferred ink portions 35a onto a (unsupported region) corrugated board substrate at the location Y. In this case of printing onto corrugated board, significant density differences can be observed and measured correlating to the regions supported and unsupported by the fluted layer, resulting in the printing artifact commonly referred to as fluting.

Figure 5:
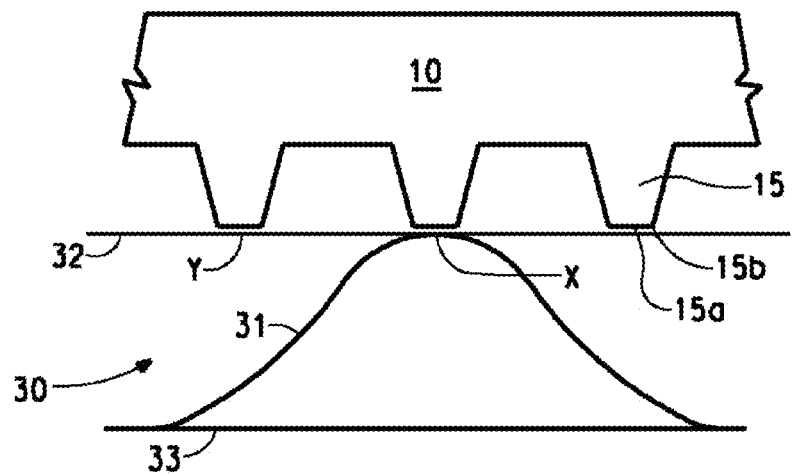
FIG. 5 is an elevation view of a relief printing plate having raised surfaces with dot shoulders that are sharp, and pressed against a corrugated board substrate.
Figure 5A:
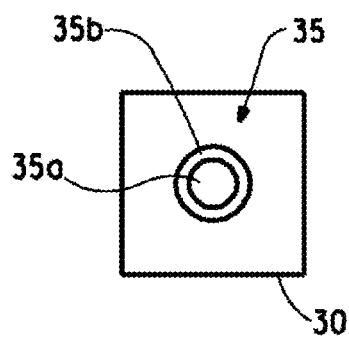
FIG. 5A is a schematic representation of a dot image of one of the raised surfaces having the sharp dot shoulders of FIG. 5, onto a supported portion of a corrugated board substrate.
Figure 5B:
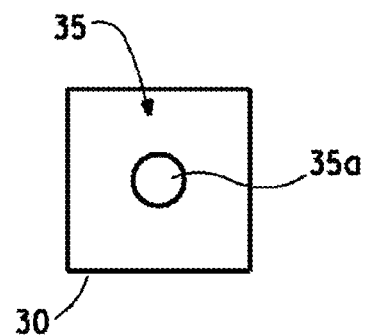
FIG. 5B is a schematic representation of a dot image of one of the raised surfaces having the sharp dot shoulders of FIG. 5, onto a non-supported portion of a corrugated board substrate.

FIG. 5 shows a relief printing plate 10 having raised surfaces 15 with dot shoulders 15b that are sharp, and pressed on a substrate such as corrugated board substrate 30 having a fluted layer 31 between two liner layers 32, 33. At location X where the fluted layer 31 provides additional support to the top liner layer 32, additional pressure is applied to the printing structure. The dot shoulder 15b also transfers ink but the shoulder is much smaller and the inked region 35 correspondingly smaller. The inked image 35 on the corrugated substrate is only slightly larger than the flat portion of the dot surface 15a. FIG. 5A represents the inked image 35 of the raised portion 15 in which the flat portion 15a and the sharp shoulder portion 15b transferred ink portions 35a and 35b onto a corrugated board substrate 30 at a location X. At location Y where the top liner 32 is not supported by fluted layer 31, less pressure is applied and the inked region 35 on the corrugated substrate 30 corresponds more directly to the flat portion 15a of the printing surface. FIG. 5B represents the inked image 35 of the raised portion 15 in which the flat portion 15a transferred ink portions 35a onto a (unsupported region) corrugated board substrate at the location Y. Since the density difference (created by the raised portions 15) between the supported and unsupported regions of the corrugated substrate is considerably smaller, the fluting printing artifact is minimized, or in some cases eliminated.

In general, the fluting printing artifact can be observed on corrugated paperboard substrates to a greater or lesser extent throughout the entire printed tonal range scale from 1% dots where the inked area is a fraction of the total area to solid printed areas. However, in some embodiments the printed mid-tone region of the tonal scale, that is from about 30 to about 70% printed dot area, tends to most effectively illustrate fluting. In other embodiments, the printed quarter-tone region, that is about 10 to about 30% printed dot area, can effectively illustrate fluting. It should be understood that the tonal scale percentages representing such printed mid-tone and quarter-tone regions is the range generally accepted by those skilled in the art, but not considered a established or binding standard.

The shape of the raised surfaces of a printing plate formed during the photopolymerization (that is, imagewise exposure in a limited oxygen concentration) and subsequent processing steps has been shown to differ based on the process used to fabricate the printing plate. In particular, the shape of the raised surfaces produced by the present process differ from the shape of the raised surfaces produced by the traditional analog process and the traditional digital process. A method has been established to evaluate the shape of the raised surfaces of a printing plate specifically quantifying the area (expressed as a percent of the total area) of the printing surface that would come in contact with the substrate during the printing process.

Given that the common imaging techniques that are used to determine the observed dot area as described above are not sufficient to describe the effective printing dot area of relief structure, a more accurate method is used to determine suitable dot structures for printing on corrugated board. The method should capture not only the observed dot area (flat portion), but also the dot shoulder region and to some extent the dot sidewall region). The method for evaluating the shape of the raised surface 15 involves measuring the printing plate surface by any one of a number of methods including surface profilimetry, optical interferometry, three dimensional optical microscopy or any such method that will provide a measure with sufficient resolution of the surface profile across a given surface area of a representative sample of material. In particular, the measurement process should generate the Z-axis data (height) for all X and Y locations in the region of interest. This information can be used to generate a cumulative sum of the area of a printing plate surface, such as the raised portions, from its uppermost regions to the floor region of the plate.

Figure 6A:
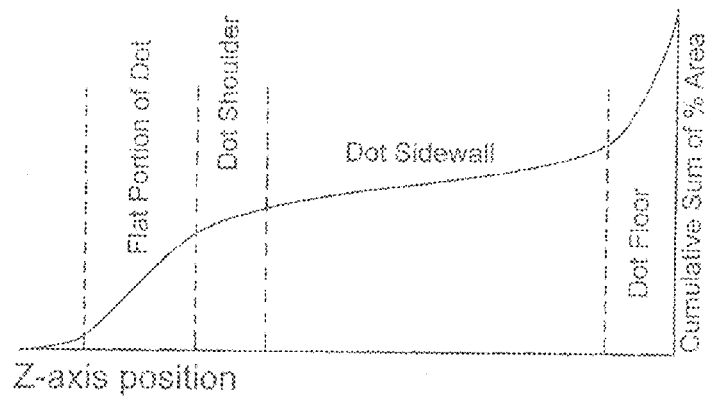
FIG. 6A, FIG. 6B, and FIG. 6C each is a schematic representation of a curve of a cumulative sum of an area relative to height of a raised surface of a relief structure separately graphed for each of three printing forms that is prepared by different workflow processes.
Figure 6B:
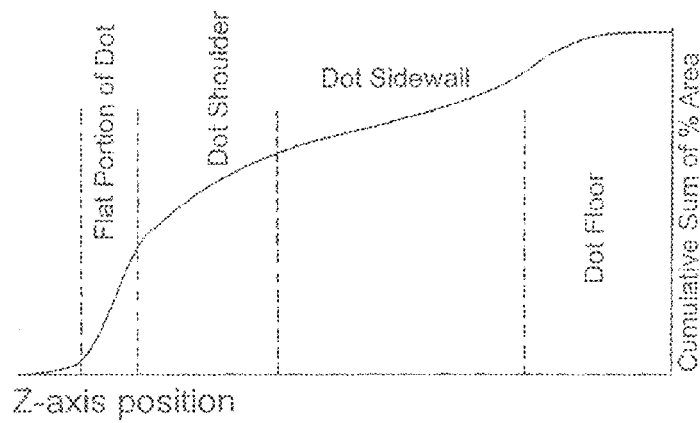
Figure 6C:
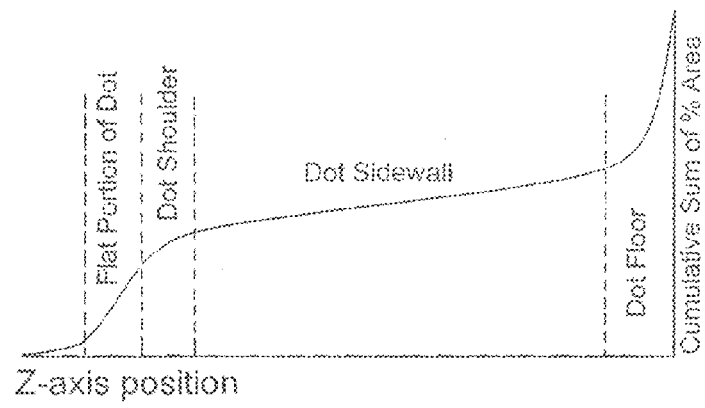

FIG. 6 shows a curve of the cumulative sum of the percent area relative to height (z-axis position) of a raised surface of a relief structure for each of three printing forms prepared by different workflow processes. Curve A is a depiction of the cumulative sum of a raised portion created in a plate prepared by the analog workflow process (imagewise exposure through phototool under vacuum). Curve B is a depiction of the cumulative sum of a raised portion created in a plate prepared by the digital workflow process (imagewise exposure through an in-situ mask in the presence of atmospheric oxygen). Curve C is a depiction of the cumulative sum of a raised portion created in a plate prepared by the present workflow process of imagewise exposure through an in-situ mask in an atmosphere of inert gas and oxygen between 190,000 to 100 ppm. The curves shown in FIG. 6 can be used to describe the printing element structure, that is, raised portions, specifically the flat portion of the printing surface is defined by the region of the curve where the area grows rapidly, and the sidewall portion of the printing element being defined by the straight line portion of the curve where the cumulative area grows less rapidly. The transition region between these two regions defines the shoulder of the printing element. The final region defined is the non-printing area referred to as the floor where the raised surface structures are attached to the bulk plate material. In FIG. 6, curve A and curve C are similar, but curve A is characterized by a slower transition from the flat portion to the sidewall portion of the printing element structure (raised portion). Curve B represents a very different printing element structure (raised portion) with an extended region of transition between the flat portion of the printing surface and the sidewall portion.

This analysis can be used to estimate the impact impression pressure will have on the surface area of the printing element that comes in contact with the anilox roller or substrate during the printing process. The surface area will be affected by a number of variables including physical plate properties such as durometer, plate mounting materials, anilox characteristics and other print conditions. As these factors can be minimized or eliminated, the present three-dimensional analysis of the raised surface provides a method for estimating the impact of impression pressure on the effective printing surface area. At minimum impression pressure only the flat portion of the raised dot surface contacts the substrate and at over impression pressure a greater surface area of the raised dot surface than the flat portion, which includes some or all of the shoulder portion, contacts the substrate. As such, for an identical change in impression pressure the cumulative surface area that would come in contact during the printing process is significantly greater for materials characterized by curve B than for materials characterized by curve A. Also, of the same identical change in impressing pressure the cumulative surface area that would come in contact during the printing process is least for materials characterized by curve C.

Since critical elements for each of the raised portion of the relief structure can be described by the curve of the cumulative sum of the percent area, the raised surface and resultant printing area can be determined by other descriptors. The point of maximum slope (first derivative reaches a maximum or when the second derivative crosses zero) represents the point at which the uppermost printing surface is defined. The flat line portion of the curve (second derivative approaches zero—for this analysis it was identified as the point where the second derivative is within 0.0005 of zero following the first derivative maxima) represents the shoulder of the dot structure. The second derivative is representative of the effective dot area under pressure.

Rather than express the shoulder area as a percentage of the dot diameter as measured by a microscope, it is also possible to express the shoulder area as the increase in radius (or diameter) of the dot from its top surface area. The top surface area or diameter of a raised dot surface can be determined from measurement with optical microscope as described above. The effective printing area (dot area) under pressure of the raised dot surface, as measured by surface profilimetry, optical interferometry, or three dimensional optical microscopy as described above, can be converted to a dot diameter that includes the shoulder portion, based upon the total pixel area determined from the screen resolution. It has been found that when the radius of the raised dot surface increased or grew less than about 10 microns (due to the influence of the shoulder portion during printing) under pressure, the printing form has acceptable print performance, that is, acceptable degree of fluting, on corrugated paperboard. In some embodiments when the radius of the raised dot surface increased or grew less than about 8 microns (due to the influence of the shoulder portion during printing) under pressure, the printing form printed images with a low level of fluting, on corrugated paperboard. In some embodiments when the radius of the raised dot surface increased or grew less than about 5 microns (due to the influence of the shoulder portion during printing) under pressure, the printing form printed images with very low or no degree of fluting on corrugated paperboard. In some embodiments when the radius of the raised dot surface increased or grew less than about 2 microns (due to the influence of the shoulder portion during printing) under pressure, the printing form printed images with very low or no degree of fluting on corrugated paperboard.

Printing Method

The steps of mounting the relief printing form on a printing press, inking the printing areas (that is, the raised portions of the relief surface) of the printing form, and contacting the inked printing areas to the substrate to transfer the pattern of ink onto the substrate are not limited, and encompass various conventional and non-conventional practices for mounting, inking, and contacting to print as is known to those skilled in the art of flexographic printing. The Fourth Edition published in 1992, and the Fifth Edition, published in 1999, of *Flexography: Principles and Practice*, published by the Foundation of Flexographic Technical Association, (Ronkonkoma, N.Y.) are suitable sources representing the field of knowledge in many aspects of flexographic printing. In particular, the chapters on mounting and proofing, the printing press, inks, flexographic printing plates, and substrates, are most applicable to the present invention.

Photosensitive Element

The photosensitive element used for preparing flexographic printing forms includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element includes a support for the photopolymerizable layer. In some embodiments, the photopolymerizable layer is an elastomeric layer that includes a binder, at least one monomer, and a photoinitiator. In some embodiments, the photosensitive element includes a layer of an actinic radiation opaque material adjacent the photopolymerizable layer, opposite the support. In other embodiments, the photosensitive element includes an image of actinic radiation opaque material suitable for use as an in-situ mask adjacent the photopolymerizable layer.

Unless otherwise indicated, the term "photosensitive element" encompasses printing precursors capable of undergoing exposure to actinic radiation and treating to form a surface suitable for printing. Unless otherwise indicated, the "photosensitive element" and "printing form" includes elements or structures in any form which become suitable for printing or are suitable for printing, including, but not limited to, flat sheets, plates, seamless continuous forms, cylindrical forms, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly(styrene/isoprene/styrene) block copolymers and poly(styrene/butadiene/styrene) block copolymers. The non-elastomer to elastomer ratio of the A-B-A type block copolymers can be in the range of from 10:90 to 35:65. The binder can be soluble, swellable, or dispersible in aqueous, semi-aqueous, water, or organic solvent washout solutions. Elastomeric binders which can be washed out by treating in aqueous or semi-aqueous developers have been disclosed by Proskow, in U.S. Pat. No. 4,177,074; Proskow in U.S. Pat. No. 4,431,723; Worns in U.S. Pat. No. 4,517,279; Suzuki et al. in U.S. Pat. No. 5,679,485; Suzuki et al. in U.S. Pat. No. 5,830,621; and Sakurai et al. in U.S. Pat. No. 5,863,704. The block copolymers discussed in Chen, U.S. Pat. No. 4,323,636; Heinz et al., U.S. Pat. No. 4,430,417; and Toda et al., U.S. Pat. No. 4,045,231 can be washed out by treating in organic solvent solutions. Generally, the elastomeric binders which are suitable for washout development are also suitable for use in thermal treating wherein the unpolymerized areas of the photopolymerizable layer soften, melt, or flow upon heating. It is preferred that the binder be present in an amount of at least 50% by weight of the photosensitive composition.

The term binder, as used herein, encompasses core shell microgels and blends of microgels and performed macromolecular polymers, such as those disclosed in Fryd et al., U.S. Pat. No. 4,956,252 and Quinn et al., U.S. Pat. No. 5,707,773.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. Generally the monomers have relatively low molecular weights (less than about 30,000). In some embodiments the monomers have a relatively low molecular weight less than about 5000. Unless otherwise indicated, the molecular weight is the weighted average molecular weight. The addition polymerization compound may also be an oligomer, and can be a single or a mixture of oligomers. Some embodiments include a polyacrylol oligomer having a molecular weight greater than 1000. The composition can contain a single monomer or a combination of monomers. The monomer compound is present in at least an amount of 5%, and in some embodiments 10 to 20%, by weight of the composition.

Suitable monomers include, but are not limited to, acrylate monoesters of alcohols and polyols; acrylate polyesters of alcohols and polyols; methacrylate monoesters of alcohols and polyols; and methacrylate polyesters of alcohols and polyols; where the alcohols and the polyols suitable include alkanols, alkylene glycols, trimethylol propane, ethoxylated trimethylol propane, pentaerythritol, and polyacrylol oligomers. Other suitable monomers include acrylate derivatives and methacrylate derivatives of isocyanates, esters, epoxides, and the like. Combinations of monofunctional acrylates, multifunctional acrylates, monofunctional methacrylates, and/or multifunctional methacrylates may be used. Other examples of suitable monomers include acrylate and methacrylate derivatives of isocyanates, esters, epoxides and the like. In some end-use printing forms it may be desirable to use monomer that provide elastomeric properties to the element. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than about 20% by weight).

Further examples of monomers can be found in U.S. Pat. No. 2,927,024; Chen, U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophenone, dialkoxy acetophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, benzoyl oxime esters, thioxanthrones, ketocoumarins, and Michler's ketone may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm. A second photoinitiator sensitive to radiation between 220 to 300 nm, preferably 245 to 265 nm, may optionally be present in the photopolymerizable composition. After treating, a plate can be finished with radiation between 220 to 300 nm to detackify the relief surfaces. The second photoinitiator decreases the finishing exposure time necessary to detackify the plate. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; liquid polyisoprene; polystyrene; poly-alpha-methyl styrene; alpha-methylstyrene-vinyltoluene copolymers; pentaerythritol ester of hydrogenated rosin; polyterpene resins; and ester resins. Generally, plasticizers are liquids having molecular weights of less than about 5000, but can have molecular weights up to about 30,000. Plasticizers having low molecular weight will encompass molecular weights less than about 30,000.

The thickness of the photopolymerizable layer can vary over a wide range depending upon the type of printing form desired. In one embodiment, the photosensitive layer can have a thickness from about 0.015 inch to about 0.250 inch or greater (about 0.038 to about 0.64 cm or greater). In another embodiment, the photosensitive layer can have a thickness from about 0.107 inch to about 0.300 inch (about 0.27 to about 0.76 cm). In some embodiments, the photosensitive layer can have a thickness from about 0.020 to 0.067 inch (0.5 mm to 1.7 mm). In yet other embodiments, the photosensitive layer can have a thickness from about 0.002 inch to 0.025 inch (0.051 to 0.64 mm).

The photosensitive element may optionally include a support adjacent the layer of the photosensitive composition. The support can be composed of any material or combination of materials that is conventionally used with photosensitive elements used to prepare printing forms. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. In some embodiments, the support is a polyester film. In one embodiment, the support is polyethylene terephthalate film. The support may be in sheet form or in cylindrical form, such as a sleeve. The sleeve can be formed of any material or combination of materials conventionally used in forming sleeves for printing. The sleeve can have a single layer, multi-layer, composite, or unitary structure. Sleeves can be made of polymeric films that are typically transparent to actinic radiation and thereby accommodate backflash exposure for building a floor in the cylindrical printing element. Multiple layered sleeves may include an adhesive layer or tape between the layers of flexible material, such as disclosed in U.S. Pat. No. 5,301,610. The sleeve may also be made of non-transparent, actinic radiation blocking materials, such as nickel or glass epoxy. The sleeve may be composed of one or more layers of a resin composition, which can be the same or different, and have fillers and/or fibers incorporated therein. Materials suitable as the resin composition are not limited, examples of which include, epoxy resins; polystyrene and polyvinyl resins, such as polyvinyl chloride and polyvinyl acetate; phenolic resins; and aromatic amine-cured epoxy resins. The fibers used in the resin composition are not limited and can include, for example, glass fibers, aramid fibers, carbon fibers, metal fibers, and ceramic fibers. Fibers incorporated with the sleeve can include continuous, woven, and/or wound materials. The support formed of a resin composition reinforced with fiber is an example of a composite sleeve. In some embodiments, the support has a thickness from 0.002 to 0.050 inch (0.0051 to 0.127 cm). The sleeve can have a wall thickness from about 0.01 and about 6.35 mm or more. In some embodiments, the sleeve has a wall thickness between about 0.25 and 3 mm. In some embodiments, the sleeve has a wall thickness between about 10 to 80 mils (0.25 to 2.0 mm), and in other embodiments 10 to 40 mils (0.25 to 1.0 mm).

Optionally, the element includes an adhesive layer between the support and the photopolymerizable layer, or a surface of the support that is adjacent the photopolymerizable layer has an adhesion promoting surface to give strong adherence between the support and the photopolymerizable layer.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. To achieve uniform thickness, the extrusion step can be advantageously coupled with a calendering step in which the hot mixture is calendered between two sheets, such as the support and a temporary coversheet, or between one flat sheet and a release roll. Alternately, the material can be extruded/calendered onto a temporary support and later laminated to the desired final support. The element can also be prepared by compounding the components in a suitable mixing device and then pressing the material into the desired shape in a suitable mold. The material is generally pressed between the support and the coversheet. The molding step can involve pressure and/or heat. The coversheet may include one or more of the additional layers which transfer to the photopolymerizable layer when the photosensitive element is formed. Cylindrically shaped photopolymerizable elements may be prepared by any suitable method. In one embodiment, the cylindrically shaped elements can be formed from a photopolymerizable printing plate that is wrapped on a carrier or cylindrical support, i.e., sleeve, and the ends of the plate mated to form the cylinder shape. The cylindrically shaped photopolymerizable element can also be prepared according to the method and apparatus disclosed by Cushner et al. in U.S. Pat. No. 5,798,019.

The photosensitive element includes at least one photopolymerizable layer, and thus can be a bi- or multi-layer construction. The photosensitive element may include one or more additional layers on or adjacent the photosensitive layer. In most embodiments the one or more additional layers are on a side of the photosensitive layer opposite the support. Examples of additional layers include, but are not limited to, a protective layer, a capping layer, an elastomeric layer, a barrier layer, and combinations thereof. The one or more additional layers can be removable, in whole or in part, during treatment. One or more of the additional layers may cover or only partially cover the photosensitive composition layer.

The protective layer protects the surface of the composition layer and can enable the easy removal of a mask material used for the imagewise exposure of the photosensitive element. The photosensitive element may include an elastomeric capping layer on the at least one photopolymerizable layer. The elastomeric capping layer is typically part of a multilayer cover element that becomes part of the photosensitive printing element during calendering of the photopolymerizable layer. Multilayer cover elements and compositions suitable as the elastomeric capping layer are disclosed in Gruetzmacher et al., U.S. Pat. No. 4,427,759 and U.S. Pat. No. 4,460,675. In some embodiments, the composition of the elastomeric capping layer includes an elastomeric binder, and optionally a monomer and photoinitiator and other additives, all of which can be the same or different than those used in the bulk photopolymerizable layer. Although the elastomeric capping layer may not necessarily contain photoreactive components, the layer ultimately becomes photosensitive when in contact with the underlying bulk photopolymerizable layer. As such, upon imagewise exposure to actinic radiation, the elastomeric capping layer has cured portions in which polymerization or crosslinking have occurred and uncured portions which remain unpolymerized, i.e., uncrosslinked. Treating causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate.

The actinic radiation opaque layer is employed in digital direct-to-plate image technology in which laser radiation, typically infrared laser radiation, is used to form a mask of the image for the photosensitive element (instead of the conventional image transparency or phototool). The actinic radiation opaque layer is substantially opaque to actinic radiation that corresponds with the sensitivity of the photopolymerizable material. Digital methods create a mask image in situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The actinic radiation opaque layer is also sensitive to laser radiation that can selectively remove or transfer the opaque layer. In one embodiment, the actinic radiation opaque layer is sensitive to infrared laser radiation. The method by which the mask is formed with the radiation opaque layer on the photosensitive element is not limited.

In one embodiment, the photosensitive element may include the actinic radiation opaque layer disposed above and covers or substantially covers the entire surface of the photopolymerizable layer opposite the support. In this embodiment the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers; non-self-oxidizing polymers; thermochemically decomposable polymers; polymers and copolymers of butadiene and isoprene with styrene and/or olefins; pyrolyzable polymers; amphoteric interpolymers; polyethylene wax, materials conventionally used as a release layer, such as polyamides, polyvinyl alcohol, hydroxyalkyl cellulose, and copolymers of ethylene and vinyl acetate; and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

In another embodiment for digitally forming the in-situ mask, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

In another embodiment, digital mask formation can be accomplished by imagewise application of the radiation opaque material in the form of inkjet inks on the photosensitive element. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier is then removed from the element prior to imagewise exposure.

The photosensitive printing element may also include a temporary coversheet on top of the uppermost layer of the element, which is removed prior to preparation of the printing form. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film.

The printing form, after exposure (and treating) of the photosensitive element, has a durometer of about 20 to about 85 Shore A. The Shore durometer is a measure of the resistance of a material toward indentation. Durometer of Shore A is the scale typically used for soft rubbers or elastomeric materials, where the higher the value the greater the resistance toward penetration. In one embodiment, the printing form has a Shore A durometer less than about 50 to about 20. In another embodiment, the printing form has a Shore A durometer less than about 40 to about 25. In another embodiment, the printing form has a Shore A durometer less than about 35 to about 30. Printing forms having a Shore A durometer less than about 40 are particularly suited for printing on corrugated paperboard. The durometer of the printing form can be measured according to standardized procedures described in DIN 53,505 or ASTM D2240-00. In some embodiments, the printing form can be mounted onto a carrier having the same or different resilience than that of the printing form. The resilience of the carrier can influence the overall resilience of the overall print form package (that is, carrier and printing form) resulting in a durometer of the package different from that of the printing form.

GLOSSARY

"Mask opening" is the "clear" area of an integral mask to allow exposure to actinic radiation of the underlying photopolymerizable material. (In some embodiments, the clear area is created by removal of actinic radiation opaque material from the element. In other embodiments, the clear area is created non-transfer of actinic radiation opaque material to the element.) Mask opening is measured with a measuring microscope. The effective mask opening area is calculated by measuring the area of the opening and dividing by the total pixel area defined by the screen resolution in lines per inch (LPI). The total pixel area is calculated using the equation $(1/LPI)^2$ and the effective mask opening is defined as the (opening area)/$(1/LPI)^2$. The mask opening is typically expressed as a percentage (of total pixel area).

"Phototool opening" is the area of the phototool that is transparent to actinic radiation expressed as a percentage of the total pixel area and is calculated similar to the above mask opening area.

"Optical Density" or simply "Density" is the degree of darkness (light absorption or opacity) of a image, and can be determined from the following relationship Density=$\log_{10}$ {1/reflectance} where reflectance is {intensity of reflected light/intensity of incident light}

"Dot size on plate" is a measure of the diameter of the dot commonly assessed using a calibrated microscope or specialized optical apparatus. The measurement typically represents accurately the flat portion of the dot structure on the plate.

"Dot area on plate" or "plate dot area" is commonly expressed as a percentage and is generally calculated by converting the dot size to an area (area=$\pi r^2$) and dividing by the total pixel area as defined by the screen resolution.

"Effective Printed Dot Area" is a calculated quantity based on the density measurements of region printed with a regular array of dots of uniform size called a tint area and density measurements of a printed region with complete ink coverage (also referred to as 100% coverage or solid coverage). The equation used is called the Murray Davies equation and is represented below:

Effective printed dot area=$(1-10^{-Dt})/(1-10^{-Ds})$ where Dt=tint density and Ds=solid density "Effective printing area (dot area) under pressure" is the dot area on the plate expressed as a percent of the total area that will come in contact with the substrate to be printed when the plate and substrate are in intimate contact with each other and when the plate/substrate exert pressure on each other.

"Plate to Print Dot Gain" represents the growth in the printed dot area from the dot area on plate expressed as a percentage of the total pixel area, to the effective printed dot area expressed as a percentage of coverage. This is simply the difference between the two.

EXAMPLES

CYREL® photopolymerizable printing plates or printing elements, CYREL® Digital Imager, CYREL® exposure unit, CYREL® ECLF exposure unit, CYREL® processor, and CYREL® Cylosol developing solution are all available from The Du Pont Company (Wilmington, Del.).

Example 1

All plates tested were CYREL® photopolymerizable printing elements having total thickness of 125 mils (3.175 mm) (which includes the thickness of the photopolymerizable layer and the support) that are suitable for use as a flexographic printing plate. The photopolymerizable printing element included a layer of a photopolymerizable composition comprising elastomeric binder, at least one monomer, and photoinitiator between a support of Mylar® (5 mils) and a coversheet (7 mils). For analog plates, the coversheet included a release layer of polyamide, which was adjacent the photopolymerizable layer. For digital plates, the coversheet included an infrared-sensitive, actinic radiation opaque layer composed of 33% carbon black and 67% polyamide (by weight), which was adjacent the photopolymerizable layer.

Each element was backflash exposed to UV light (365 nm) for 85 seconds (17.6 mjoules/cm²/sec) on a CYREL® exposure unit to form a floor. After imagewise exposure, each element was developed in organic solvent, CYREL® Cylosol washout solution for 8.9 minutes in a CYREL® 1000P type processor to remove the unexposed areas and form a relief printing plate. The plate was then dried for 2 hours in a convection oven. After drying, the plate was further exposed to UV light (254 nm) on the exposure unit for 5 minutes to light finish the plate, eliminating any residual tackiness.

Each element was imagewise exposed through a test target image to UV light (365 nm) as described below. The test target image was designed to be essentially the same for the phototool used in the analog workflow and for the in-situ mask formed adjacent the photopolymerizable layer used in the digital workflow. The test target image incorporated a number of sufficiently large patches of varying percent print area representing ink tint percentages from 2% to 100% to ensure that patches of identical dot size on the plate were available regardless of the plate production workflow and to allow for sufficient area to quantify fluting performance. The test target image also included a solid ink density bar across a leading edge to assure impression uniformity on the press (printed) sheet, several patches for assessing exposure uniformity, positive and reverse type, and line targets.

Plate A—Analog Workflow

For Plate A, a CYREL® photopolymer printing element, type TDR, was exposed and processed as described above using analog workflow. For the back exposure, instead of 85 seconds the exposure time was 113 seconds at 17.6 mjoules/$cm^2$/sec. For the imagewise exposure, the coversheet was removed, an image-bearing negative (i.e., phototool having the test target as previously described) was placed on a surface of the element opposite the support and vacuum was drawn, and was exposed to UV radiation for 15 minutes (17.6 mjoules/$cm^2$/sec) on the exposure unit.

Plate B—Digital Workflow

Plate B was also a CYREL® photopolymer printing element, type TDR, included the infrared-sensitive, actinic radiation-opaque layer (instead of the release layer). The plate was exposed and processed as described above using digital workflow. The coversheet was removed, and an in-situ mask of the test target was formed on the photosensitive element by imagewise ablating the infrared-sensitive, actinic radiation-opaque layer with infrared laser radiation in a CYREL® Digital Imager, Model SPARK 4835 Optics 40, from ESKO Graphics Imaging GmbH (Itzehoe, Germany). A person of ordinary skill in the art of digital platemaking knows that the mask image's digital file can be adjusted to compensate for oxygen inhibition and printed-dot gain, typically associated with digital workflow plates. As such, appropriate 'bump' and compensation curves were applied to the digital file of the mask image to create the mask image on Plate B. For Plate B, the digital file of the mask image was appropriately bumped by about 4%.

For imagewise exposure of Plate B, the photosensitive element was placed in the exposure unit and exposed to UV radiation through the in-situ mask for about 16 min (33.9 mjoules/$cm^2$/sec) in air, that is, an atmospheric oxygen concentration of 21% (210,000 ppm).

Plate C—Modified Digital Workflow-Controlled Oxygen Environment

Plate C, also a CYREL® photopolymer printing element, type TDR, included the infrared-sensitive, actinic radiation-opaque layer (instead of the release layer). The plate was exposed and processed using digital workflow. The coversheet was removed, and an in-situ mask of the test target was formed on the element by imagewise ablating the infrared-sensitive, actinic radiation-opaque layer with infrared laser radiation in a CYREL® Digital Imager. A person of ordinary skill in the art of digital platemaking knows that the digital file of the mask image can be adjusted to compensate for oxygen inhibition and printed-dot gain, typically associated with plates made by digital workflow. However, unlike Plate B, the digital file of the mask image was not adjusted with bump and compensation curves for Plate C due to the exposure environment, i.e., modified digital workflow environment.

For imagewise exposure of Plate C, a CYREL® 2001 ECLF exposure unit was modified to include a UV transparent enclosure that resides on the exposure bed of the unit and sealed along its perimeter to provide desired conditions within the enclosure for the element during imagewise exposure. An inlet port introduced nitrogen (inert gas) through tapered hose-fittings into the chamber and an outlet port purged the initial air from the chamber. An Alpha Omega Series 3000 Trace Oxygen Analyzer (from Alpha Omega Instruments, Cumberland, R.I.) located at or adjacent to the outlet port measured the oxygen concentration exiting the chamber. During UV exposure, Plate C was enclosed within the chamber and on the exposure bed with the chamber environment primarily of nitrogen with some oxygen during UV exposure.

The roof of the closed exposure chamber was constructed out of FEP Teflon® while the four walls were made from tubular metal. The photosensitive element was inserted into the chamber and the nitrogen was turned on to evacuate the air in the chamber. This was accomplished by placing the photosensitive element on the bed of the exposure unit, placing the closed exposure chamber over the element on the bed, and purging the atmospheric air by introducing nitrogen gas. The imaging exposure was then conducted under this nitrogen blanket. In practice, materials that are less UV absorbing can be used and would not require similar compensation.

In this Example, Plate C was exposed to UV radiation through the in-situ mask for about 20 minutes (33.9 mjoules/$cm^2$/sec) in the primarily nitrogen environment with continuous reduction of oxygen concentration. Exposure began when the concentration of the oxygen within the closed exposure chamber was about 1,000 ppm (0.1% oxygen) and continued while nitrogen gas was continuously introduced into the closed exposure chamber to reduce the concentration of oxygen to less than about 100 ppm when the exposure ended.

For each Plates A through C, a measuring microscope (Nikon Measurescope, model MM-11, from NIKON (USA) (Melville, N.Y.)) was used to measure dot size in the patch areas of the plate. The relief structure of the printing plate included raised portions and recessed portions. Each patch representing a particular % print area in the mask included a plurality or raised portions of the same size. The raised portions, which carry ink to the substrate being printed, are typically referred to as dots. Microscope analysis determined the patch that was closest to a 30% area coverage, that is, the patch that provides flat raised surfaces having a diameter of about 157 micron for each dot, based on line screen ruling of 100 lines per inch. For the purposes of this example, the plate dot area of 30% was chosen as a basis of comparison for the 3 plates A through C, because the mid-tone region of the tint scale tends to very effectively illustrate fluting. Comparative analysis of the plates A through C, would expectedly remain substantially the same at other selected plate dot areas.

TABLE 1

| | Workflow | Mask or Phototool Opening | Dot Diameter (micron) | Calculated Dot Area on Plate |
|---|---|---|---|---|
| Plate A | Analog | 28% | 155.4 | 29.4% |
| Plate B | Digital; exposure in atmospheric oxygen | 50% | 158.7 | 30.7% |
| Plate C | Modified Digital; exposure in nitrogen atmosphere with less than 190,000 ppm oxygen | 30% | 157.8 | 30.3% |

Printing of Plates

Plates A through C were each mounted with double-sided tape to a polyester-reinforced cushioned carrier (R/bak foam, type SF, 0.060 inch from Rogers Corp. (Rogers, Conn.)), which had a mounting lead edge strip attached to its leading end. The carrier was then mounted onto a print cylinder by securing the mounting lead edge strip to a groove in the print cylinder and securing a trailing end of the carrier to the cylinder in a Bobst Flexo 160 printing press. The plates were inked with an anilox roll that was a 500 line screen with a volume of 3.0 billion cubic microns per square inch (BCMI) at 60 degrees. The ink used was a water-based BCM ink having 9.5 pH and a viscosity of 15.4 seconds with 4 DIN cup. The plates printed the ink printed a pattern of ink according to the relief image onto corrugated paperboard that was Kemiart B-flute 200# coated. The plate was set to print at impression settings of minimum (kiss) contact, +0.010 inch, and +0.020 inch over impression.

Evaluation and Analysis

For each Plate A through C, patches that corresponded to the 30% plate tint area (i.e., dot area on plate) and those that correspond to an equal density of 0.40+/−0.03 on the printed substrate were analyzed. These areas were then identified on the printed corrugated board and a 3.5 inch square sample was removed from the board for density measurement analysis on an X-RITE Spectrodensitometer, model 528, from X-RITE, Inc., (Grandville, Mich.). Multiple measurements were taken and spaced to ensure density readings spanned both fluted and non-fluted regions in the printed image. The density measurements were converted into % dot area coverage using the Murray Davies equation to enable calculation of actual dot gain (printed dot area-plate dot area).

The printed image on corrugated board was evaluated for fluting effect which manifests as regions of dark printing, i.e., bands of higher ink coverage resulting in a higher density reading, alternating with regions of light printing, i.e., bands of lower in coverage (or less than high) resulting in lower ink density reading, that correspond to the underlying fluting structure of the corrugated paperboard. Rankings were determined by providing unlabeled samples to a panel of ten knowledgeable observers and having each independently rank the fluting performance from best to worst, on a scale of 1 to 10 where 1 represents the best flute performance, and 10 represents the worst flute performance. An average fluting ranking is provided based on patches that represent approximately equal plate dot areas (based on the microscope analysis of the dot diameter) as well as patches that represent approximately equal density values (based on the density measurements). Plate to Print gain refers to the increase in dot size from the plate dot area (which in this example is at an approximately equal plate dot area of 30%) to the dot area effectively printed on the corrugated substrate.

TABLE 2

|  | Effective Printed Dot Area | Plate to Print Gain | Fluting Rank based on Ave. Area | Fluting Rank based on Ave. Density |
| --- | --- | --- | --- | --- |
| Plate A | 62.8% | 33.4% | 5.4 | 4.1 |
| Plate B | 72.6% | 41.9% | 6.3 | 7.4 |
| Plate C | 56.4% | 26.1% | 2.9 | 2.3 |

The fluting exhibited in the image printed by Plate A is consistent with and representative of the level of fluting performance considered acceptable by the flexographic printing industry for printing on corrugated board. While Plate B has the same physical properties as Plate A, Plate B differs in that it was made using digital workflow. Plates equivalent to Plate B have been evaluated in corrugated printing market, and have not been accepted due to its poor fluting performance. As such, the fluting exhibited by the image printed by Plate B would not be acceptable to the corrugated board printing industry. Plate C represents the same material as Plate B, however Plate C was made using the modified digital workflow of the present invention as described above using particular environment during exposure. The fluting exhibited in the image printed by Plate C had the lowest fluting effect compared to that of Plates A and B having the least ink density differences between supported and unsupported regions of the corrugated board, and was a significant improvement in terms of reduced level of fluting from the image printed by Plate A that is currently industry acceptable, and even greater improvement from the image printed by Plate B made by digital workflow. Plate C which was exposed in a modified digital workflow produced plate to press dot gains significantly lower than both Plate A made by conventional analog workflow and Plate B than conventional digital workflow (exposure in air).

Each of Plates A through C, underwent three dimensional (3D) structural analysis using a Hirox microscope, model KH-770, from Hirox-USA (River Edge, N.J.)). The 3D microscope generates an image 1600×1200 microns (X by Y) with a dimension of 0.517 microns per pixel. The Z-axis (height of dot) data for each X-Y position was captured in order to characterize the 'printing region' of the dot. This data was loaded into a spreadsheet software package to generate a cumulative sum of Z-axis data (area by height) effectively slicing successive layers of the plate structure from the top surface down in the minus Z direction.

Three-dimensional analysis showed that while all three plates had a relatively flat printing area, Plate A and Plate C had a significantly different relief structure than Plate B. The raised portions or dots of Plate A and Plate C had a top surface area that was relatively flat, and a shoulder area that sharply transitioned from the top surface area of the dot to a supporting sidewall of the dot. The raised portions or dots of Plate B had the top printing surface of the dot and a shoulder that much more gradually transitioned to the sidewall of the dot.

The surface area of the raised surface of the plate as a percent of the total surface area was calculated as a function of depth (Z axis position) and related to the surface area of the plate that came into contact with the substrate as pressure between the substrate and the printing plate was applied (effective dot printing area under pressure). In addition, the second derivative of the cumulative sum of the percent surface area of the raised surface, i.e., dots, for each of the Plates A through C was taken to determine the effective dot printing area under pressure. As a result of the differences in plate structures described above, the effective plate area coming in contact with the substrate under pressure varied dramatically. Plate A, generally regarded as very acceptable for fluting in the corrugated board printing industry, had effective printing area under pressure of 38%. This represents a growth over the area measured using the microscope of 8.6% and that growth represents an increase of approximately 29% over the original size. Plate B, regarded as poor for fluting performance, exhibits a 60% effective printing area under pressure. This represents an increase, i.e., growth, of about 29% over the printed area measured using a microscope, and represents an increase of about 96% over the original size. Plate C, ranked significantly better for fluting exhibits a 32% effective dot area under pressure. This represents an increase (i.e., growth) of less than 2% over the printed area measured using a microscope, and represents an increase of 5.6% over the original size.

These results are consistent with the ranking of the printed images described above.

TABLE 3

|  | Effective Print Area Under Pressure | Meas. Dot Area on Plate | Difference* | Difference as a Percent of Dot Area on Plate |
| --- | --- | --- | --- | --- |
| Plate A | 38% | 29.4% | 8.6% | 29.3% |
| Plate B | 60% | 30.7% | 29.3% | 95.7% |
| Plate C | 32% | 30.3% | 1.7% | 5.6% |

*Difference is the (Effective Print Area under Pressure) less the (Measured Dot Area on Plate).

Rather than express the shoulder area as a percentage of the dot diameter as measured by a microscope, the shoulder area may also be expressed as an increase in radius (or diameter) of the dot from its essentially flat top printing surface area. The effective printing area (dot area) under pressure as measured by the Hirox microscope was converted to a dot diameter that includes the shoulder portion (based upon the second derivative calculation of the transition from the shoulder portion to the sidewall portion using the curve of the cumulative surface area). The Example showed that performance is best, i.e., reduced fluting, when the radius of the dot increased less than about 2 microns (Plate C), and has been acceptable if the radius increased up to approximately 10 microns (Plate A), but is clearly unsatisfactory when the radius increased over 30 microns (Plate B) for a dot size between 155 to 160 micron representing 30% print area at 100 lines/inch resolution. The same or substantially the same results were observed for other sizes of dots each representing a different percent print area of the tonal range.

TABLE 4

| Sample | Dot Diameter of Plate (Optical Microscope) (Microns) | Dot Diameter + Shoulder (Hirox Microscope) (Microns) | Difference between (Dot Diameter including Shoulder) and (Dot Diameter of Plate) (Microns) | Shoulder Width (additional radial distance) (Microns) |
|---|---|---|---|---|
| Plate A | 155.4 | 176.7 | 21.3 | 10.7 |
| Plate B | 158.7 | 222.0 | 63.3 | 31.7 |
| Plate C | 157.8 | 162.1 | 4.3 | 2.1 |

Example 2

Modified digital workflow process described for Plate C in Example 1 was used for Example 2 with the following exceptions. Two oxygen meters were used; an Alpha Omega Series 2000, and Alpha Omega Series 3000, each measuring a different range of oxygen concentration. Several plates were prepared, i.e., exposed in the modified ECLF exposure unit, under different conditions, wherein exposure to actinic radiation was initiated when the oxygen concentration in the closed exposure chamber (as shown in FIGS. 1 and 2) reached 190,000 ppm; 150,000 ppm; 100,000 ppm; 20,000 ppm; and 10,000 ppm. The chamber continued to be purged of oxygen during exposure. Oxygen concentration was recorded every minute during the purging and exposure of the photosensitive element to actinic radiation.

Table 5 shows the oxygen concentration in the closed exposure chamber when the actinic radiation was initiated and the microscopic observation (Hirox 3D) of the wire frame images of the plates at the different concentrations were recorded. A quantitative indicator from a visual observation was developed wherein an observation number of 0 was assigned to a poor dot structure performance and an unacceptable dot structure. An observation number of 4-5 was assigned to very good to superior dot structures which were considered acceptable for subsequent printing applications.

TABLE 5

| Oxygen Concentration at Initiation of Exposure | Microscopic Observation of the Dots |
|---|---|
| Atmospheric Oxygen | 0 |
| 190,000 ppm | 4 |
| 150,000 ppm | 4 |
| 100,000 ppm | 4 |
| 20,000 ppm | 4 |
| 10,000 ppm | 5 |

Figure 7:
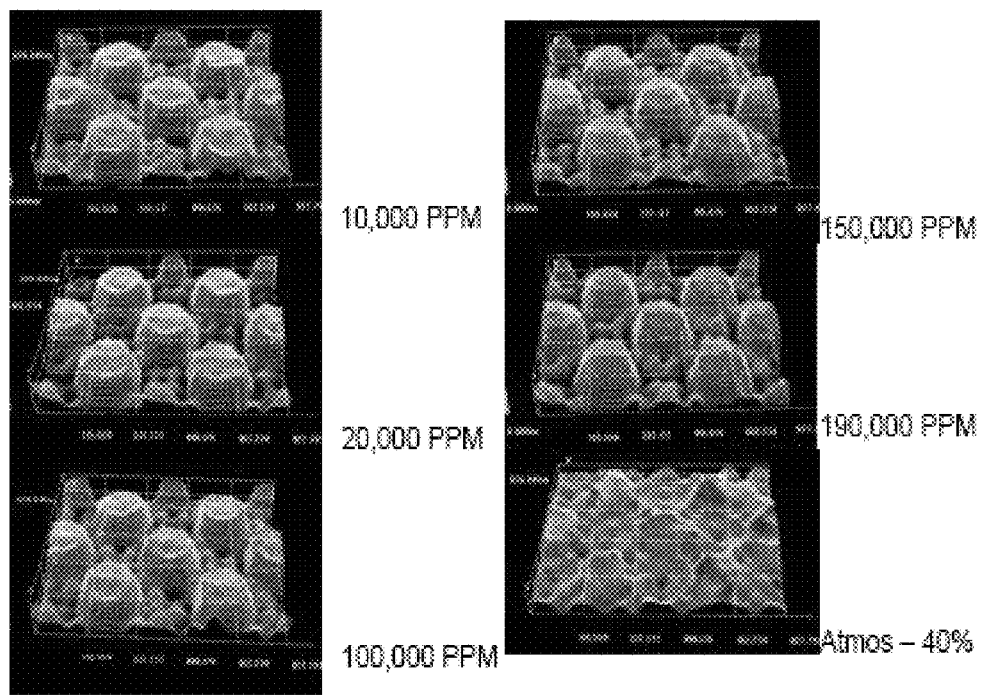
FIG. 7 is a series of wire frame images of one embodiment of raised surfaces or dot structures resulting in a relief printing form as a function of oxygen concentration at the initiation of actinic radiation exposure.

FIG. 7 shows wire frame images of the dot structures on plates that were exposed under different oxygen concentrations by initiating the actinic radiation exposure at different starting points during purging/introduction of nitrogen gas. The images were developed on the Hirox 3D system. The images showed that all plates with initiation points from 190,000 to 10,000 ppm show significantly improved dot structures over the plates made at atmospheric conditions. The dot structures made under oxygen controlled environment were fully formed. On the other hand, the dot structures under atmospheric conditions (21% oxygen) were not fully formed.

Example 3

Two photosensitive elements having a IR laser radiation sensitive layer (i.e., digital plates), CYREL® photopolymer printing elements type DPC-155, were imaged on an Esko Spark plate-setter with identical patterns to form an in-situ mask having regions of dots representing a range of dot areas including 2%, 10% and 30% of the area coverage. One plate was exposed to ultraviolet radiation using the standard, conventional digital workflow and processed as described above for Example 1, Plate B. The second plate was exposed to ultraviolet radiation using the modified (inert environment) workflow by placing the plate in a modified ECLF exposure unit. The modified ECLF exposure unit included a chamber consisting of a roof and four walls constructed of Lexan that resided on the bed of the exposure unit. The chamber was sealed from the external environment by applying tape along a perimeter of the chamber where the wall contacted the bed, and purged of atmospheric air by providing a continuous stream of nitrogen (nitrogen gas having less than 10 ppm oxygen) though an inlet port in the chamber and monitoring the oxygen concentration of the gas being forced through the outlet port. Exposure was initiated when the oxygen concentration being monitored at the outlet port reached 1000 ppm. Following exposure in the modified environment the plate was subjected to standard processing and post processing treatments identical to those provided to the first plate, using the conditions as described in Example 1.

Plates were then examined under a microscope and found to exhibit differential characteristics in the relief structure (consistent at each of the 2%, 10%, and 30% dot areas) of the plates that were exposed in the two different environments as follows.

| | Conventional Digital Workflow | Modified Digital Workflow |
|---|---|---|
| Uppermost (i.e., flat) Printing Surface | Smaller than mask opening (128 micron) | Same as mask opening (151 micron) |

-continued

| | Conventional Digital Workflow | Modified Digital Workflow |
|---|---|---|
| Dot Shoulder | Rounded | Sharp transition |
| Pixelization Artifacts* | None apparent | Obvious |

*Pixelization artifacts are characterized by the edge of the dot, i.e., shoulder portion, having a jagged nature and is indicative of forming a curved structure with square image elements. Pixelization is apparent in the actual dot structure itself, however is not reflected in the printed image.

This artifact can only be detected by examination under magnification.

A conclusion from this Example was that thorough purging of the environment of oxygen during exposure (to less than 1000 ppm) produces a significantly different raised dot relief structure (compared to exposure in the presence of atmospheric oxygen) that was apparent to a knowledgeable observer.

Example 4

Figure 8:
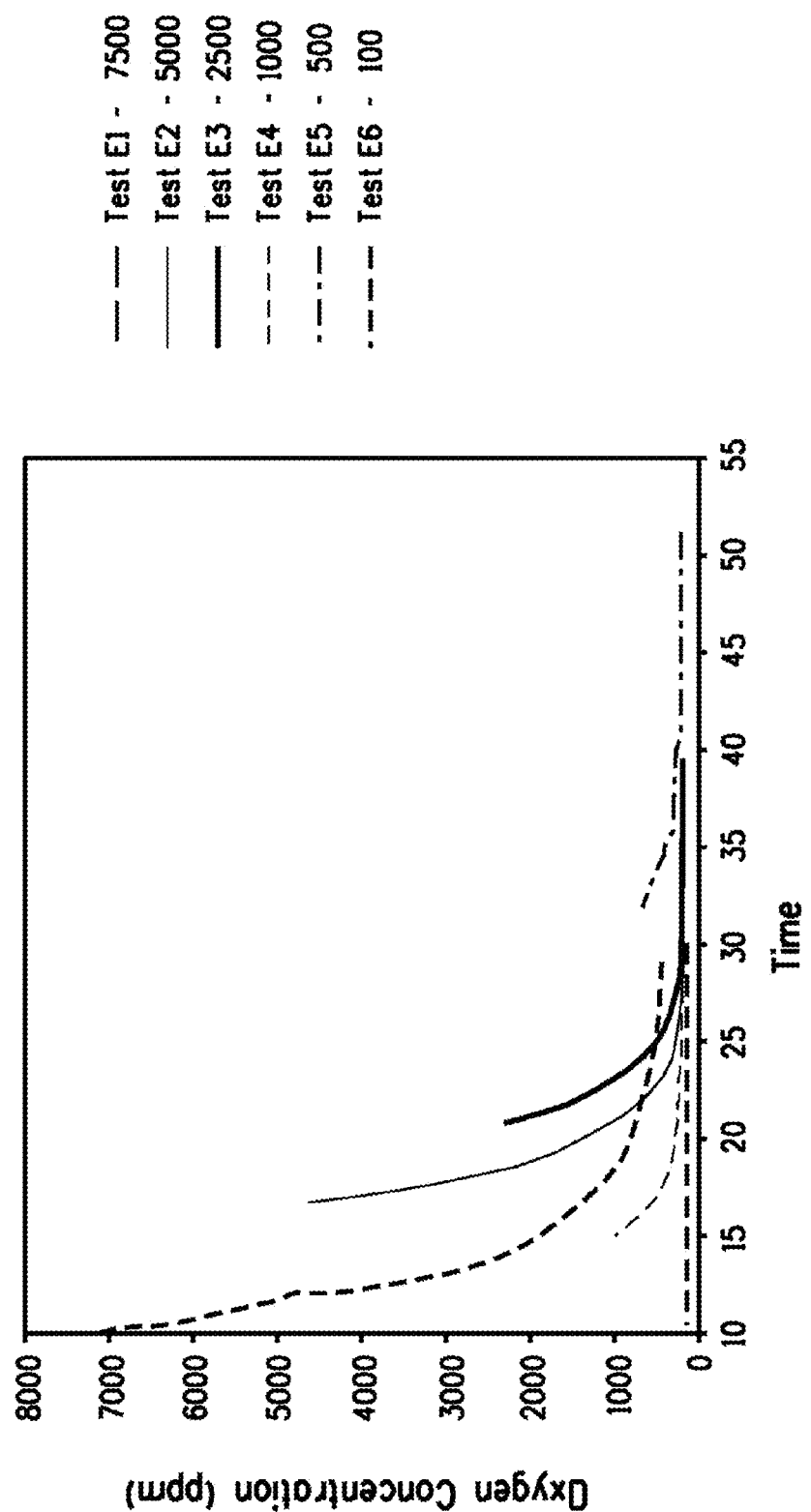
FIG. 8 is a chart showing a plot of the concentration of oxygen in a closed exposure chamber versus time for each test, E1 through E6, in which a photosensitive element was exposed to actinic radiation as described in Example 4.

Several CYREL® photopolymer printing elements, type DPC-155 plates, having an infrared laser radiation sensitive layer for forming a mask were imaged on an Esko Spark plate-setter with identical patterns to form regions on the in-situ mask of dots representing a range of dot areas including 2%, 20%, 30% 40% and 50% of the area coverage. Following mask imaging, the plate was placed in an enclosable exposure chamber as described in Example 1 (composed of tubular metal walls with Teflon® FEP roof) and located in a CYREL® ECLF 2000 exposure frame. A supply of nitrogen (having less than 10 ppm oxygen) was attached to the inlet port of the chamber and allowed to mix with and purge the atmospheric gasses present in the chamber. Gases exiting the chamber were monitored with an oxygen sensor recording the oxygen concentration over time. When the oxygen concentration reached a predefined point, exposure to ultraviolet radiation was initiated. FIG. 8 shows the plot of the oxygen concentration versus time during imagewise exposure by ultraviolet radiation for each of the tests designated. For test E1, exposure of the plate started when oxygen concentration reached 7500 ppm in the chamber. For test E2, exposure of the plate to ultraviolet radiation started when oxygen concentration reached 5000 ppm in the chamber. For test E3, exposure of the plate started when oxygen concentration reached 2500 ppm in the chamber. For test E4, exposure of the plate started when oxygen concentration reached 1000 ppm in the chamber. For test E5, exposure of the plate started when oxygen concentration reached 500 ppm in the chamber. For test E6, exposure of the plate started when oxygen concentration reached 100 ppm in the chamber.

| | Test E1 | Test E2 | Test E3 | Test E4 | Test E5 | Test E6 |
|---|---|---|---|---|---|---|
| Exposure Time (minutes) | 19.5 | 19.5 | 19 | 19.5 | 19.5 | 19.5 |
| Exposure time (min) at <100 ppm | 0 | 0 | 0 | 0 | 0 | 19 |
| Exposure time (min) at <500 ppm | 5 | 13.5 | 14.5 | 17 | 19 | 19 |
| Exposure time (min) at <1000 ppm | 10.5 | 15.5 | 16 | 19.5 | 19.5 | 19.5 |
| Exposure time (min) at <2500 ppm | 15 | 17.5 | 19 | 19.5 | 19.5 | 19.5 |

Following exposure, each of the test plates were processed according to standard processing conditions as described in Example 1 and visually evaluated for the dot structure formed. In all cases the dot structure formed compared favorably with structures formed using the analog method of plate fabrication, wherein the resultant dot shape of plates exposed in the inert environments appeared similar to an analog dot with a flat top surface and sharp shoulder.

| Test | Oxygen Concentration (ppm) When Exposure Starts | Measured Dot Surface Diameter (Printing Surface) (micron) |
|---|---|---|
| E1 | 7500 | 137.03 |
| E2 | 5000 | 138.57 |
| E3 | 2500 | 139.72 |
| E4 | 1000 | 140.68 |
| E5 | 500 | 141.7 |
| E6 | 100 | 139.4 |

| | Test E1-7500 | Test E2-5000 | Test E3-2500 | Test E4-1000 | Test E5-500 | Test E6-100 |
|---|---|---|---|---|---|---|
| Length of Exposure | 19.5 | 19.5 | 19 | 19.5 | 19.5 | 19.5 |
| Exposure Time <100 PPM | 0 | 0 | 0 | 0 | 0 | 19 |
| Exposure Time <500 PPM | 5 | 13.5 | 14.5 | 17 | 19 | 19 |
| Exposure Time <1000 PPM | 10.5 | 15.5 | 16 | 19.5 | 19.5 | 19.5 |
| Exposure Time <2500 PPM | 15 | 17.5 | 19 | 19.5 | 19.5 | 19.5 |
| Result | Digital Appearance | Digital Appearance | Digital Appearance | Digital Appearance | Digital Appearance | Digital Appearance |

The results of this Example suggests that imagewise exposure can be conducted with relatively high levels of oxygen present during the exposure as long as some minimum amount of exposure is accomplished at a low oxygen concentration, and still attain the desired relief structure in which the raised relief elements, i.e., dots, have a sharp shoulder transition. From Example 3, Test E1, it was determined that when atmospheric oxygen is present during imagewise exposure a significant amount of 'oxygen inhibition' is observed. In the present Example, the theoretical value for the dot printing surface was calculated at 141.3 micron, and the resultant dots for Tests E1 through E6 were essentially equivalent to the theoretical value. Measurements taken from photo-micrographs of the dots formed on the plates of Example 4 indicate that the change in dot size (<4 microns) under different exposure conditions, as demonstrated by Tests E2 through E6, is significantly less than the magnitude in change compared to exposures conducted in the presence of atmospheric oxygen versus in an inert environment having less than 7,500 ppm oxygen.

Figure 9:
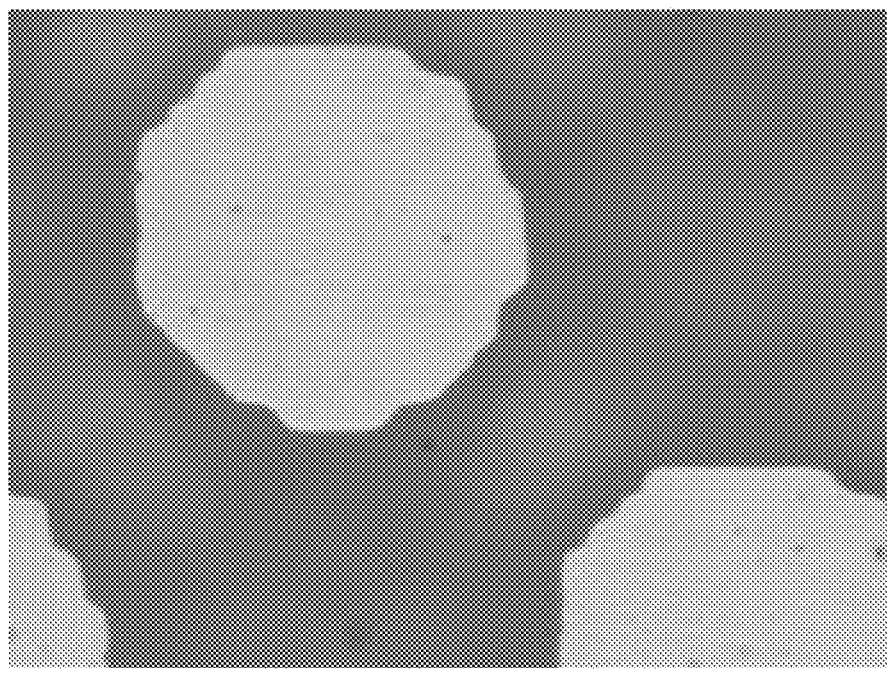
FIG. 9 is a reproduction of a photomicrograph of at least one raised element structure, i.e., dot, that was prepared in Example 4 showing pixelization artifact.

Examination of the photo-micrographs a reproduction of which is shown in FIG. 9 also indicated evidence of pixelization on all raised element (i.e., dot) structures prepared in Example 4 (Tests E2 through E6) which was not evident on plates exposed in an environment of atmospheric oxygen (Test E1). In particular, the pixelization artifact was detected in the image of the dot structure for Test E2 through E6 where the exposure is initiated at an oxygen concentration of 7,500 ppm or less. Evidence of pixelization is characterized by the jagged nature of the dot edge and is indicative of forming a curved structure with square image elements. It should be noted structures made in the presence of oxygen tend to form smoothly curved dot edges as illustrated in Example 3.

Example 5

A second test, following the same procedures as outlined in Example 4, was conducted using exposures initiated at oxygen concentrations of 7,500, 5,000, 2,500, 1,000 and 100 ppm. Optical microscope measurements were taken of the printing surface of dots ranging in size of the printing area coverage of 2%, 20%, 30% 40% 50% for each of the dot sizes and compared against the theoretical size (based on 100 LPI screen ruling).

| Dot Area | Theo-retical | Dot Size at Various Oxygen Concentrations During Exposure | | | | |
|---|---|---|---|---|---|---|
| | | 7500 ppm | 5000 ppm | 2500 ppm | 1000 ppm | 100 ppm |
| 2% | 40.5 | 38.6 | 39.4 | 40.4 | 40.6 | 38.4 |
| 20% | 128.2 | 128.1 | 127.4 | 128.0 | 127.7 | 127.8 |
| 30% | 157.0 | 157.1 | 156.8 | 155.9 | 157.5 | 158.2 |
| 40% | 181.3 | 178.6 | 179.6 | 180.0 | 180.4 | 182.3 |
| 50% | 202.7 | 200.3 | 199.1 | 199.9 | 201.0 | 203.3 |

These results provided in the table above and indicate there is essentially no difference in dot size from the predicted value irrespective of the exposure concentration at the start of the exposure.

Example 6

This Example demonstrated the capability of the present method to provide desired dot structure in photopolymerizable printing elements when imagewise exposure is initiated at higher initial oxygen concentrations (i.e., greater than 7,500 ppm up to 190,000 ppm).

To conduct this Example, a second oxygen meter was required that operated at a higher range of oxygen sensitivity. To accomplish this, an Alpha Omega series 2000 oxygen meter was placed in series with the Alpha Omega Series 3000 meter on the outlet side of the exposure chamber. Oxygen concentration was monitored every minute during the purge and exposure times using both instruments. Imagewise exposures were conducted under normal atmospheric conditions in which the oxygen concentration measured at 218,000 ppm (Test Plate D1), as well as in inert environments in which an exposure chamber was purging of atmospheric conditions and imagewise exposure was initiated at the following oxygen concentrations: 190,000 ppm; 170,000 ppm; 150,000 ppm; 100,000 ppm; 50,000 ppm; 20,000 ppm; 10,000 ppm; 5,000 ppm; and 1,000 ppm (Test Plates MD1 through MD9, respectively). CYREL® photopolymer printing elements, type 125 DPC (having an infrared laser radiation sensitive layer for producing a mask by digital workflow) were used for the Test Plates. The imagewise exposure to ultraviolet radiation was conducted a 2000 ECLF exposure unit. Inert environment exposures were conducted in a closed exposure chamber composed of a metal frame sides with Teflon® FEP as a UV transparent top surface, residing on the bed of the exposure unit. Standard solvent processing was conducted following exposure as described in Example 1.

| Test Plate | Starting Oxygen Concentration (ppm) | Average of Dot | Difference from Theoretical Dot |
|---|---|---|---|
| D1 | 210,000 | 119.4 | −37.6 |
| MD1 | 190,000 | 152.6 | −4.4 |
| MD2 | 170,000 | 156.8 | −0.2 |
| MD3 | 150,000 | 157.2 | 0.2 |
| MD4 | 100,000 | 157.7 | 0.7 |
| MD5 | 50,000 | 158.3 | 1.3 |
| MD6 | 20,000 | 160.8 | 3.8 |
| MD7 | 10,000 | 162.4 | 5.4 |
| MD8 | 5,000 | 159.1 | 2.1 |
| MD9 | 1,000 | 158.5 | 1.5 |

Measurements of the top printing surface dimension of a 30% dot were taken on three different dots in a single field of view. The measurements of the top surface were taken at two different orientations that were basically orthogonal to each other on a plane of the top surface, with one orientation horizontal from east to west and the other orientation vertical from north to south of the plane of the top surface, and were averaged as reported in the above table. The theoretical dot size for a 30% coverage dot at 100 lines per inch is effectively 157 microns (156.98). Note that the plate exposed in atmospheric oxygen, Test Plate D1, which was prepared according to conventional digital workflow, produced a dot of 119.35 microns or a reduction from theoretical of over 37 microns. All other dots produced in the inert environment, Test Plates MD1 through MD9, ranged essentially +/−5 microns of the theoretical dot size.

Photomicrographs of the plate (Test Plate D1) made using the conventional digital workflow (exposure in atmospheric oxygen) and of the plate (Test Plate MD1) made in the modified digital workflow (exposure in an inert environment) that was triggered at an oxygen concentration of 190,000 ppm were taken and the images compared. Comparison of the image in each of the photographs showed a significant difference in size of the printing surface as evidenced by the data. In addition, the plate produced by conventional digital workflow, Test Plate D1, lacked obvious pixelization whereas the plate, Test Plate MD1, produced by modified digital workflow in an environment starting with oxygen concentration of 190,000 ppm had the evident pixelization. Pixelization described in these Examples is not a functional problem with the printed image, but is indicative of the capability of the plate system to accurately replicate the exact image to a very high degree of resolution as present on the mask.

The Table 6A lists the percentage of the total exposure time each plate (Test Plates MD1 through MD9) was the listed oxygen concentration during exposure as measured by one or two oxygen concentration meters (Alpha Omega Series 2000 or Series 3000 meter) for the exposures starting at various measured oxygen concentrations. The designation "M2" represents the Alpha Omega series 2000 oxygen meter, which is most sensitive to oxygen concentrations greater than 10,000 ppm; and the designation "M3" represents the Alpha Omega series 3000 oxygen meter, which is most sensitive to oxygen concentrations less than 10,000 ppm.

The far right column of Table 6A indicates the minimum amount of exposure time, represented as a percent, at or below a given oxygen concentration where an 'analog like' dot structure, i.e., a dot having a flat top and sharp shoulders, was generated. From the data in Table 6A, an acceptable result was observed when at least 33% (35%, 51%, 48%, etc.) of the total exposure was conducted in an environment representing less than 1000 ppm of oxygen in the exposure chamber. Similarly, it is noted that an acceptable result was achieved when at least 50% (52%, 60%) of the total exposure was conducted in an environment representing less than 2500 ppm of oxygen in the exposure chamber. Similarly, it is noted that an acceptable result was achieved when at least 46% (52%, 61%) of the total exposure was conducted in an environment representing less than 5000 ppm of oxygen in the exposure chamber. Further, it is noted that an acceptable result was achieved when at least 58% (67%) of the total exposure was conducted in an environment representing less than 10,000 ppm of oxygen in the exposure chamber.

The conclusion based on these results is that sufficient polymerization will occur that will still provide an analog-like dot shape, i.e., raised printing element having a flat top surface and sharp shoulder transition, at unexpected and surprising high levels of oxygen remaining in the exposure chamber during a portion of the exposure process.

TABLE 6A

| O₂ Concentration | Oxygen concentration | | | | | | | | | | | | | | | | | Minimum Acceptable |
|---|---|---|---|---|---|---|---|---|---|---|---|---|---|---|---|---|---|---|
| | 19% | | 17% | | 15% | | 10% | | 5% | | 2% | | 1% | | 0.5% | 0.25% | 0.10% | |
| | Oxygen meter | | | | | | | | | | | | | | | | | |
| | M2 | M3 | M2 | M3 | M2 | M3 | M2 | M3 | M2 | M3 | M2 | M3 | M2 | M3 | M2 M3 | M3 | M3 | |
| | Percentage of Exposure Time at the Oxygen Concentration | | | | | | | | | | | | | | | | | |
| <190,000 | 96% | | | | | | | | | | | | | | | | | 95.8% |
| <170,000 | 92 | | 100 | | | | | | | | | | | | | | | 91.7% |
| <150,000 | 92 | | 96 | | 100 | | | | | | | | | | | | | 91.7% |
| <100,000 | 88 | | 91 | | 98 | | 91 | | | | | | | | | | | 87.5% |
| <50,000 | 79 | | 83 | | 88 | | 87 | | 95 | | | | | | | | | 79.2% |
| <20,000 | 67 | | 74 | | 79 | | 78 | | 86 | | 100 | | | | | | | 66.7% |
| <10,000 | 58 | 67 | 65 | 70 | 70 | 74 | 70 | 74 | 76 | 76 | 91 | 96 | 96 | 96 | | | | 58.3% |
| <5,000 | 46 | 58 | 52 | 61 | 60 | 70 | 61 | 65 | 62 | 71 | 78 | 87 | 83 | 91 | 96 96 | | | 45.8% |
| <2,500 | | 50 | | 52 | | 60 | | 61 | | 62 | | 78 | | 83 | 83 91 | 92 | | 50.0% |
| <1,000 | | 33 | | 35 | | | 51 | 48 | | 48 | | 70 | | 65 | | 83 | 88 | 95 | 33.3% |
| <500 | | | | | | | 42 | | | | | | | | | 65 | 79 | 91 | 41.9% |
| <100 | | | | | | | | | | | | | | | | | | 55 | 54.9% |

| | Atmo | | | | | | | | | | | |
|---|---|---|---|---|---|---|---|---|---|---|---|---|
| | 19% | | 17% | | 15% | | 10% | | 5% | | 2% | |
| O2 Meter | 2000 | 3000 | 2000 | 3000 | 2000 | 3000 | 2000 | 3000 | 2000 | 3000 | 2000 | 3000 |
| 87.16% | 0% | 96% | | | | | | | | | | |
| 77.98% | 0% | 92% | | 100% | | | | | | | | |
| 68.81% | 0% | 92% | | 96% | | 100% | | | | | | |
| 45.87% | 0% | 88% | | 91% | | 98% | | 91% | | | | |
| 22.94% | 0% | 79% | | 83% | | 88% | | 87% | | 95% | | |
| 9.17% | 0% | 67% | | 74% | | 79% | | 78% | | 86% | | 100% |
| 4.59% | 0% | 58% | 67% | 83% | 70% | 70% | 74% | 70% | 74% | 76% | 76% | 91% | 96% |
| 2.29% | 0% | 46% | 58% | 52% | 61% | 79% | 70% | 61% | 65% | 62% | 71% | 78% | 87% |
| 1.15% | 0% | | 50% | | 52% | | 60% | | 61% | | 62% | | 78% |
| 0.46% | 0% | | 33% | | 35% | | 51% | | 48% | | 48% | | 70% |
| 0.23% | 0% | | | | | | 42% | | | | | | |
| 0.05% | 0% | | | | | | | | | | | | |
| Average Dot Diameter (μ) | 119.4 | 152.6 | 152.6 | 156.8 | 156.8 | 157.2 | 157.2 | 157.7 | 157.7 | 158.3 | 158.3 | 160.8 | 160.8 |

| | Atmo | | | | | | Min Acceptable |
|---|---|---|---|---|---|---|---|
| | 1% | | 0.50% | | 0.25% | 0.10% | |
| O2 Meter | 2000 | 3000 | 2000 | 3000 | 3000 | 3000 | |
| 87.16% | 0% | | | | | | 95.8% |
| 77.98% | 0% | | | | | | 91.7% |
| 68.81% | 0% | | | | | | 91.7% |
| 45.87% | 0% | | | | | | 87.5% |
| 22.94% | 0% | | | | | | 79.2% |
| 9.17% | 0% | | | | | | 66.7% |
| 4.59% | 0% | 96% | 96% | | | | 58.3% |
| 2.29% | 0% | 83% | 91% | 96% | 96% | | 45.8% |
| 1.15% | 0% | | 83% | 83% | 91% | 92% | 50.0% |
| 0.46% | 0% | | 65% | | 83% | 88% | 95% | 33.3% |
| 0.23% | 0% | | | | 65% | 79% | 91% | 41.9% |
| 0.05% | 0% | | | | | 55% | 54.5% |
| Average Dot Diameter (μ) | 119.4 | 162.4 | 162.4 | 159.1 | 159.1 | | 158.5 | |

What is claimed is:

1. An apparatus for exposing a photosensitive relief printing form precursor to actinic radiation in an environment having a concentration of oxygen less than atmospheric oxygen, comprising:
   (a) a closed exposure chamber comprising an inlet for introducing an inert gas into the closed exposure chamber, an outlet for removing at least oxygen from the closed exposure chamber, and having means for sealing the closed exposure chamber from an environment external to the closed exposure chamber, wherein the chamber is configured to enclose the precursor and comprises four side walls and a top roof, which is mounted on an exposure bed of a flat-bed exposure unit to form a bottom of the closed exposure chamber opposite the roof, wherein the closed exposure chamber is sealed from external environment through a gasket which is secured to an end of the side walls adjoining the exposure bed;
   (b) a source of actinic radiation located adjacent to the closed exposure chamber;
   (c) a source for the inert gas connected to the inlet;
   (d) means for controlling the concentration of oxygen within the closed exposure chamber in a range between 190,000 ppm and 100 ppm; and
   (e) means for initiating actinic radiation exposure when the concentration of oxygen within the closed exposure chamber is less than or equal to 190,000 ppm,
   wherein the roof is at a height sufficient to create an open space for the internal environment above the precursor, and further wherein the inlet of the closed exposure chamber is connected to a gas input manifold from which the inert gas enters the closed exposure chamber and is distributed into the open space.

2. The apparatus of claim 1 wherein the source of actinic radiation is positioned internal to the closed exposure chamber.

3. The apparatus of claim 1 wherein the source of actinic radiation is positioned external to the closed exposure chamber.

4. The apparatus of claim 1, wherein the roof of the closed exposure chamber is transparent to actinic radiation.

5. The apparatus of claim 4 wherein the roof material is selected from the group consisting of polycarbonates, acrylics, fluorocarbon resins, and glass.

6. The apparatus of claim 1 wherein the closed exposure chamber is mounted on the exposure bed of a flat-bed exposure unit having the source of actinic radiation.

7. The apparatus of claim 6 wherein the exposure bed which forms a bottom of the closed exposure chamber opposite the roof is configured to have the photosensitive relief printing form precursor placed thereon.

8. The apparatus of claim 6 wherein the exposure bed is transparent to actinic radiation.

9. The apparatus of claim 1, wherein the closed exposure chamber is mounted on a frame of an exposure unit.

10. The apparatus of claim 1 wherein the means for controlling the concentration of oxygen comprises a means for measuring oxygen concentration comprising at least one oxygen meter connected to the outlet or the closed exposure chamber.

11. The apparatus of claim 10 further comprising a feedback control between the oxygen meter and the gas source, wherein the oxygen concentration is automatically adjusted.

12. The apparatus of claim 1 wherein the inert gas has a flow rate and the means for controlling the concentration of oxygen comprises means for metering the inert gas at the flow rate for a time sufficient for the oxygen concentration to be in a range of 190,000 to 100 parts per million.

13. The apparatus of claim 1 wherein the roof is vaulted.

14. The apparatus of claim 13 wherein the vaulted roof forms one or more domes, arches, or cambers bowed above a bottom support of the chamber.

15. The apparatus of claim 1 wherein the roof forms a vault about 0.125 to about 1.5 inch above a plane formed at an intersection of the roof to the walls and perpendicular to the side walls.

* * * * *